(12) United States Patent
Yuasa et al.

(10) Patent No.: US 7,897,201 B2
(45) Date of Patent: Mar. 1, 2011

(54) METHOD FOR MANUFACTURING MAGNETORESISTANCE EFFECT ELEMENT

(75) Inventors: Hiromi Yuasa, Kawasaki (JP); Hideaki Fukuzawa, Kawasaki (JP); Yoshihiko Fuji, Kawasaki (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 978 days.

(21) Appl. No.: 11/703,830

(22) Filed: Feb. 8, 2007

(65) Prior Publication Data

US 2007/0202249 A1 Aug. 30, 2007

(30) Foreign Application Priority Data

Feb. 9, 2006 (JP) ................ P2006-032261

(51) Int. Cl.
*G11B 21/00* (2006.01)
*B05D 3/00* (2006.01)
*H05H 1/00* (2006.01)
*C23F 3/00* (2006.01)

(52) U.S. Cl. ......... 427/131; 427/130; 427/132; 427/127; 427/532; 427/535; 427/551; 427/576; 216/63; 216/66; 216/67; 216/76

(58) Field of Classification Search .......... 427/130–131, 427/532, 551, 535; 216/76
See application file for complete search history.

(56) References Cited

U.S. PATENT DOCUMENTS

| | | |
|---|---|---|
| 5,304,975 A | 4/1994 | Saito et al. |
| 5,313,186 A | 5/1994 | Schuhl et al. |
| 5,448,515 A | 9/1995 | Fukami et al. |
| 5,459,687 A | 10/1995 | Sakakima et al. |
| 5,549,978 A | 8/1996 | Iwasaki et al. |
| 5,668,688 A | 9/1997 | Dykes et al. |
| 5,715,121 A | 2/1998 | Sakakima et al. |
| 5,768,181 A | 6/1998 | Zhu et al. |
| 5,768,183 A | 6/1998 | Zhu et al. |
| 5,777,542 A * | 7/1998 | Ohsawa et al. ............ 338/32 R |
| 5,923,504 A | 7/1999 | Araki et al. |
| 5,936,402 A | 8/1999 | Schep et al. |
| 5,949,622 A | 9/1999 | Kamiguchi et al. |
| 5,962,080 A | 10/1999 | Tan et al. |

(Continued)

FOREIGN PATENT DOCUMENTS

CN 1431651 7/2003

(Continued)

OTHER PUBLICATIONS

Office Action in Korean Application No. 10-2008-0104637 dated Nov. 10, 2008 and English-language translation thereof.

(Continued)

*Primary Examiner* — Timothy H Meeks
*Assistant Examiner* — Mandy C Louie
(74) *Attorney, Agent, or Firm* — Nixon & Vanderhye, PC

(57) ABSTRACT

A method is for manufacturing a magnetoresistance effect element having a magnetization fixed layer, a non-magnetic intermediate layer, and a magnetization free layer being sequentially stacked. The method includes: forming at least a part of a magnetic layer that is to become either one of the magnetization fixed layer and the magnetization free layer; forming a function layer including at least one of an oxide, a nitride, and a fluoride on the part of the magnetic layer; and removing a part of the function layer by exposing the function layer to either one of an ion beam and plasma irradiation.

6 Claims, 22 Drawing Sheets

U.S. PATENT DOCUMENTS

| | | | |
|---|---|---|---|
| 6,002,553 | A | 12/1999 | Stearns et al. |
| 6,013,365 | A | 1/2000 | Dieny et al. |
| 6,016,241 | A | 1/2000 | Coffey et al. |
| 6,033,584 | A | 3/2000 | Ngo et al. |
| 6,074,743 | A | 6/2000 | Araki et al. |
| 6,096,434 | A | 8/2000 | Yano et al. |
| 6,114,056 | A | 9/2000 | Inomata et al. |
| 6,132,892 | A | 10/2000 | Yoshikawa et al. |
| 6,159,593 | A | 12/2000 | Iwasaki et al. |
| 6,205,008 | B1 | 3/2001 | Gijs et al. |
| 6,219,275 | B1 | 4/2001 | Nishimura |
| 6,275,363 | B1 | 8/2001 | Gill |
| 6,303,218 | B1 | 10/2001 | Kamiguchi et al. |
| 6,313,973 | B1 | 11/2001 | Fuke et al. |
| 6,330,137 | B1 | 12/2001 | Knapp et al. |
| 6,340,533 | B1 | 1/2002 | Ueno et al. |
| 6,348,274 | B1 | 2/2002 | Kamiguchi et al. |
| 6,353,318 | B1 | 3/2002 | Sin et al. |
| 6,368,706 | B1 | 4/2002 | Iwasaki et al. |
| 6,400,537 | B2 | 6/2002 | Sakakima et al. |
| 6,452,763 | B1 | 9/2002 | Gill |
| 6,469,926 | B1 | 10/2002 | Chen |
| 6,473,275 | B1 | 10/2002 | Gill |
| 6,495,275 | B2 | 12/2002 | Kamiguchi et al. |
| 6,517,896 | B1 | 2/2003 | Horng et al. |
| 6,519,123 | B1 | 2/2003 | Sugawara et al. |
| 6,522,507 | B1 | 2/2003 | Horng et al. |
| 6,556,390 | B1 | 4/2003 | Mao et al. |
| 6,567,246 | B1 | 5/2003 | Sakakima et al. |
| 6,603,642 | B1 | 8/2003 | Arki et al. |
| 6,636,391 | B2 | 10/2003 | Watanabe et al. |
| 6,674,615 | B2 | 1/2004 | Hayashi |
| 6,686,068 | B2 | 2/2004 | Carey et al. |
| 6,690,163 | B1 | 2/2004 | Hoshiya et al. |
| 6,710,984 | B1 | 3/2004 | Yuasa et al. |
| 6,720,036 | B2 * | 4/2004 | Tsunekawa et al. .......... 427/535 |
| 6,759,120 | B2 | 7/2004 | Jongill et al. |
| 6,767,655 | B2 | 7/2004 | Hiramoto et al. |
| 6,770,382 | B1 | 8/2004 | Chang et al. |
| 6,853,520 | B2 | 2/2005 | Fukuzawa et al. |
| 6,882,509 | B2 | 4/2005 | Chang et al. |
| 6,903,907 | B2 | 6/2005 | Hasegawa |
| 6,905,780 | B2 | 6/2005 | Yuasa et al. |
| 6,929,957 | B2 | 8/2005 | Min et al. |
| 6,937,446 | B2 | 8/2005 | Kamiguchi et al. |
| 6,937,447 | B2 | 8/2005 | Okuno et al. |
| 7,038,893 | B2 | 5/2006 | Koui et al. |
| 7,046,489 | B2 | 5/2006 | Kamiguchi et al. |
| 7,116,529 | B2 | 10/2006 | Yoshikawa et al. |
| 7,163,755 | B2 | 1/2007 | Hiramoto et al. |
| 7,177,121 | B2 | 2/2007 | Kojima et al. |
| 7,196,877 | B2 | 3/2007 | Yoshikawa et al. |
| 7,218,484 | B2 | 5/2007 | Hashimoto et al. |
| 7,223,485 | B2 | 5/2007 | Yuasa et al. |
| 7,240,419 | B2 | 7/2007 | Okuno et al. |
| 7,301,733 | B1 | 11/2007 | Fukuzawa et al. |
| 7,304,825 | B2 | 12/2007 | Funayama et al. |
| 7,331,100 | B2 | 2/2008 | Li et al. |
| 7,372,672 | B2 | 5/2008 | Nishiyama |
| 7,379,278 | B2 | 5/2008 | Koui et al. |
| 7,390,529 | B2 | 6/2008 | Li et al. |
| 7,476,414 | B2 | 1/2009 | Fukuzawa et al. |
| 7,514,117 | B2 | 4/2009 | Fukuzawa et al. |
| 7,525,776 | B2 | 4/2009 | Fukuzawa et al. |
| 7,602,592 | B2 | 10/2009 | Fukuzawa et al. |
| 7,610,674 | B2 | 11/2009 | Zhang et al. |
| 7,776,387 | B2 | 8/2010 | Fuji et al. |
| 7,785,662 | B2 | 8/2010 | Fuji et al. |
| 2001/0005300 | A1 | 6/2001 | Hayashi |
| 2001/0009063 | A1 | 7/2001 | Saito et al. |
| 2001/0014000 | A1 | 8/2001 | Tanaka et al. |
| 2001/0040781 | A1 | 11/2001 | Tanaka et al. |
| 2002/0048127 | A1 * | 4/2002 | Fukuzawa et al. ......... 360/324.1 |
| 2002/0048128 | A1 | 4/2002 | Kamiguchi et al. |
| 2002/0051380 | A1 | 5/2002 | Kamiguchi et al. |
| 2002/0054461 | A1 | 5/2002 | Fujiwara et al. |
| 2002/0058158 | A1 | 5/2002 | Odagawa et al. |
| 2002/0073785 | A1 | 6/2002 | Prakash et al. |
| 2002/0114974 | A1 | 8/2002 | Carey et al. |
| 2002/0135935 | A1 | 9/2002 | Covington |
| 2002/0145835 | A1 | 10/2002 | Suzuki et al. |
| 2002/0150791 | A1 | 10/2002 | Yuasa et al. |
| 2002/0159201 | A1 | 10/2002 | Li et al. |
| 2002/0191355 | A1 | 12/2002 | Hiramoto et al. |
| 2003/0011463 | A1 | 1/2003 | Iwasaki et al. |
| 2003/0026049 | A1 | 2/2003 | Gill |
| 2003/0035256 | A1 | 2/2003 | Hayashi et al. |
| 2003/0049389 | A1 | 3/2003 | Tsunekawa et al. |
| 2003/0053269 | A1 | 3/2003 | Nishiyama |
| 2003/0099868 | A1 | 5/2003 | Tanahashi et al. |
| 2003/0104249 | A1 | 6/2003 | Okuno et al. |
| 2003/0123200 | A1 | 7/2003 | Nagasaka et al. |
| 2003/0128481 | A1 | 7/2003 | Seyama et al. |
| 2003/0156360 | A1 | 8/2003 | Kawawake et al. |
| 2004/0021990 | A1 | 2/2004 | Koui et al. |
| 2004/0121185 | A1 | 6/2004 | Fukuzawa et al. |
| 2004/0137645 | A1 | 7/2004 | Hu et al. |
| 2004/0150922 | A1 * | 8/2004 | Kagami et al. ............. 360/324.2 |
| 2004/0169963 | A1 | 9/2004 | Okuno et al. |
| 2004/0201929 | A1 * | 10/2004 | Hashimoto et al. ........ 360/324.1 |
| 2004/0246631 | A1 | 12/2004 | Dieny et al. |
| 2005/0042478 | A1 | 2/2005 | Okuno et al. |
| 2005/0068855 | A1 | 3/2005 | Morikawa et al. |
| 2005/0073778 | A1 | 4/2005 | Hasegawa et al. |
| 2005/0094317 | A1 | 5/2005 | Funayama |
| 2005/0094322 | A1 | 5/2005 | Fukuzawa et al. |
| 2005/0094327 | A1 | 5/2005 | Okuno et al. |
| 2005/0141148 | A1 | 6/2005 | Aikawa et al. |
| 2005/0276998 | A1 | 12/2005 | Sato |
| 2006/0002184 | A1 | 1/2006 | Hong et al. |
| 2006/0018057 | A1 | 1/2006 | Huai |
| 2006/0034022 | A1 | 2/2006 | Fukuzawa et al. |
| 2006/0050444 | A1 | 3/2006 | Fukuzawa et al. |
| 2006/0098353 | A1 | 5/2006 | Fukuzawa et al. |
| 2006/0114620 | A1 | 6/2006 | Sbiaa et al. |
| 2006/0164764 | A1 | 7/2006 | Kamiguchi et al. |
| 2007/0070556 | A1 | 3/2007 | Zhang et al. |
| 2007/0081276 | A1 | 4/2007 | Fukuzawa et al. |
| 2007/0092639 | A1 | 4/2007 | Fuji et al. |
| 2007/0159733 | A1 | 7/2007 | Hashimoto et al. |
| 2007/0172690 | A1 | 7/2007 | Kim et al. |
| 2007/0188936 | A1 | 8/2007 | Zhang et al. |
| 2007/0188937 | A1 | 8/2007 | Carey et al. |
| 2007/0202249 | A1 | 8/2007 | Yuasa et al. |
| 2007/0253122 | A1 | 11/2007 | Fukuzawa et al. |
| 2007/0259213 | A1 | 11/2007 | Hashimoto et al. |
| 2008/0005891 | A1 | 1/2008 | Yuasa et al. |
| 2008/0008909 | A1 | 1/2008 | Fuji et al. |
| 2008/0013218 | A1 | 1/2008 | Fuke et al. |
| 2008/0062577 | A1 | 3/2008 | Fukuzawa et al. |
| 2008/0068764 | A1 | 3/2008 | Fukuzawa et al. |
| 2008/0080098 | A1 | 4/2008 | Fuke et al. |
| 2008/0102315 | A1 | 5/2008 | Fukuzawa et al. |
| 2008/0192388 | A1 | 8/2008 | Zhang et al. |
| 2008/0204944 | A1 | 8/2008 | Aikawa et al. |
| 2008/0239590 | A1 | 10/2008 | Fuke et al. |
| 2008/0278864 | A1 | 11/2008 | Zhang et al. |
| 2009/0059441 | A1 | 3/2009 | Zhang et al. |
| 2009/0061105 | A1 | 3/2009 | Fukuzawa et al. |
| 2009/0091864 | A1 | 4/2009 | Carey et al. |
| 2009/0091865 | A1 | 4/2009 | Zhang et al. |
| 2009/0104475 | A1 | 4/2009 | Fuji et al. |
| 2009/0109581 | A1 | 4/2009 | Fukuzawa et al. |
| 2009/0141408 | A1 | 6/2009 | Fukuzawa et al. |
| 2009/0162698 | A1 | 6/2009 | Fukuzawa et al. |
| 2009/0225477 | A1 | 9/2009 | Fukuzawa et al. |
| 2010/0037453 | A1 | 2/2010 | Zhang et al. |
| 2010/0091412 | A1 | 4/2010 | Yuasa et al. |
| 2010/0091414 | A1 | 4/2010 | Yuasa et al. |
| 2010/0091415 | A1 | 4/2010 | Yuasa et al. |
| 2010/0092803 | A1 | 4/2010 | Yuasa et al. |

FOREIGN PATENT DOCUMENTS

| | | |
|---|---|---|
| CN | 1183517 | 1/2005 |
| CN | 1746980 | 3/2006 |
| EP | 0 687 917 | 12/1995 |
| EP | 0 877 398 | 11/1998 |

| | | |
|---|---|---|
| EP | 1 328 027 | 7/2003 |
| EP | 1 400 957 | 3/2004 |
| EP | 1 548 762 | 6/2005 |
| EP | 1 607 941 | 12/2005 |
| EP | 1 626 393 | 2/2006 |
| GB | 2 390 168 | 12/2003 |
| JP | 08-049063 | 2/1996 |
| JP | 09-116212 | 5/1997 |
| JP | 09-306733 | 11/1997 |
| JP | 10-173252 | 6/1998 |
| JP | 10-324969 | 12/1998 |
| JP | 11-121832 | 4/1999 |
| JP | 11-154609 | 6/1999 |
| JP | 11-238923 | 8/1999 |
| JP | 11-296820 | 10/1999 |
| JP | 2000-137906 | 5/2000 |
| JP | 2000-156530 | 6/2000 |
| JP | 2000-188435 | 7/2000 |
| JP | 2000-215414 | 8/2000 |
| JP | 2000-228004 | 8/2000 |
| JP | 2000-293982 | 10/2000 |
| JP | 2001-094173 | 4/2001 |
| JP | 2001-143227 | 5/2001 |
| JP | 2001-176027 | 6/2001 |
| JP | 2001-229511 | 8/2001 |
| JP | 2001-237471 | 8/2001 |
| JP | 2001-358380 | 12/2001 |
| JP | 2002-076473 | 3/2002 |
| JP | 2002-124721 | 4/2002 |
| JP | 2002-150512 | 5/2002 |
| JP | 2002-204010 | 7/2002 |
| JP | 2002-208744 | 7/2002 |
| JP | 2003-086866 | 3/2003 |
| JP | 2003-110168 | 4/2003 |
| JP | 2003-152243 | 5/2003 |
| JP | 2003-204095 | 7/2003 |
| JP | 2004-006589 | 1/2004 |
| JP | 2004-153248 | 5/2004 |
| JP | 2004-214234 | 7/2004 |
| JP | 2005-097693 | 4/2005 |
| JP | 2005-136309 | 5/2005 |
| JP | 2005-166896 | 6/2005 |
| JP | 2005-339784 | 12/2005 |
| JP | 2005-353236 | 12/2005 |
| JP | 2006-019743 | 1/2006 |
| JP | 2006-049426 | 2/2006 |
| JP | 2006-054257 | 2/2006 |
| JP | 2006-135253 | 5/2006 |
| JP | 2006-319343 | 11/2006 |
| JP | 2007-221135 | 8/2007 |
| KR | 10-0302029 | 6/2001 |
| KR | 2001-0081971 | 8/2001 |
| KR | 2002-0015295 | 2/2002 |
| KR | 10-0413174 | 12/2003 |
| KR | 10-2005-0027159 | 3/2005 |
| KR | 10-2005-0118649 | 12/2005 |
| KR | 10-2006-0050327 | 5/2006 |
| WO | 97/47982 | 12/1997 |
| WO | 03/032338 | 4/2003 |

OTHER PUBLICATIONS

Office Action dated Mar. 14, 2008 in Korean Application No. 10-2007-13222 and English-language translation thereof.
Japanese Office Action issued on Aug. 18, 2009 in JP 2006-032261 (English Translation Attached).
Office Action in Chinese Patent Application No. 2007/0005511.2, dated Sep. 11, 2009, and English-language translation.
I.I. Mazin; "How to Define and Calculate the Degree of Spin Polarization in Ferromagnets"; Physical Review Letters, vol. 83, 1427, 1999. (Abstract).
S. Sanvito, et al. "Breakdown of the Resistor Model of CPP-GMR in Magnetic Multilayered Nanostructures", Physical Review B, vol. 61, No. 20, May 15, 2000, pp. 14225-14228. (Abstract).
Didier Bozec, et al., "Mean Free Path Effects on the Current Perpendicular to the Plane Magnetoresistance of Magnetic Multilayers", Physical Review Letters, vol. 85, No. 6, Aug. 7, 2000, pp. 1314-1317. (Abstract).
D. Bozec, et al., "Comparative Study of the Magnetoresistance of MBE-Grown Multilayers: [Fe/Cu/Co/Cu]$_N$ and [Fe/Cu]$_N$ [Co/Cu]$_N$" Physical Review B, vol. 60, No. 5, Aug. 1, 1999, pp. 3037-3039. (Abstract).
Hideaki Fukuzawa, et al., "MR Ratio Enhancement by NOL Current-Confined-Path Structures in CPP Spin Valves", IEEE Transactions on Magnetics, Jul. 2004, vol. 40, No. 4, pp. 2236-2238.
A. Losev et al., "Electron Beam Induced Reduction Of of CuO in the Presence of a Surface Carbonaceous Layer: An XPS/Hreels Study", Surface Science 213 (1989) pp. 554-579.
K.S. Kim et al., "X-Ray Photoelectron Spectroscopic Studies of Nickel-Oxygen Surfaces Using Oxygen and Argon Ion-Bombardment", Surface Science 43 (1974), pp. 625-643.
N. Garcia, et al. "Magnetoresistance in Excess of 200% in Ballistic Ni Nanocontacts at Room Temperature and 100 Oe," Physical Review Letters, vol. 82, No. 14, Apr. 5, 1999, pp. 2923-2926.
J.J. Versluijs, et al., "Magnetoresistance of Half-Metallic Oxide Nanocontracts," Physical Review Letters, vol. 87, No. 2, Jul. 9, 2001, pp. 026601-1 through 026601-4.
W.F. Egelhoff, et al., "Oxygen as a Surfactant in the Growth of Giant Magnetoresistance Spin Valves", J Appl. Phys., vol. 82, No. 12, pp. 6142-6151, Dec. 15, 1997.
Y. Kamiguchi et al., "CoFe Specular Spin Valves With a Nano Oxide Layer", The 1999 IEEE International Magnetics Conference, May 18-21, 1999.
H.A. Ferrera et al. "Rapid DNA hybridization based on ac field focusing of magnetically labeled target DNA"; Applied Physics Letters, 87, 013901 (2005); pp. 013901-1 to 013901-3.
L. Lagae et al. "Magnetic biosensors for genetic screening of cystic fibrosis"; IEE Proc. Circuits Devices Syst. vol. 152, No. 4, Aug. 2005, pp. 393-400.
Meguro, K., Hoshiya, H., Watanabe, K., Hamakawa, Y., and Fuyama, M., "Spin-valve films using syntehtic ferrimagnets for pinned layer," (IEEE Trans. Mag., 35(5), 1999, 2925-2927. (Abstract).
C. Vouille et al, J.Appl.Phys. 81 4573 (1997); "Inverse CPP-GMR in (A/Cu/Co/Cu) multilayers . . . by impurities" (Abstract).
A.C. Reilly et al, J.Magn. Magn. Mater, 195 (1999) L269; "Perpendicular giant magnetoresistance of . . . unified picture." (Abstract).
J. Bass et al, J. Magn. Magn. Mater, 200 (1999) 274; "Current-perpendicular (CPP) magnetoresistance in magnetic metallic multilayers." (Abstract).
L. Villa, et al., Journal of Applied Physics, vol. 87, No. 12, pp. 8610-8614, Current Perpendicular Magnetoresistances of NiFeCo and NiFe "Permalloys", Jun. 15, 2000. (Abstract).
Yonsei University Master Thesis, "Voltage Difference Amplification Circuit for Improving the Sensing Characteristics of MRAM", Dec. 2005 and brief English-language translation thereof.
Ceramist vol. 4 No. 5, Special Edition, "Magnetic Sensor Technologies and Applications Using Giant Magnetoresistance effect", Oct. 2001.
Seoul University Doctoral Thesis, A Study on the Development of New Spin Wave Structures for Magnetoresistive RAM based on Giant Magnetoresistance and Tunneling, Aug. 2001 and brief English-language translation thereof.
Dieny et al., "Magnetotransport properties of magnetically soft spin-valve structures (invited)", J. Appl. Phys., vol. 69, No. 8, pp. 4774-4779 (1991).
Takagishi et al., "The Applicability of CPP-GMR Heads for Magnetic Recording", IEEE Trans. Magn., vol. 38, No. 5, pp. 2277-2282 (2002).
Dieny et al., "Giant magnetoresistance of magnetically soft sandwiches: Dependence on temperature and on layer thicknesses", Phys. Rev., vol. 45, No. 2, pp. 806-813 (1992).
Nagasaka et al., "Giant magnetoresistance properties of specular spin valve films in a current perpendicular to plane structure", J. Appl. Phys., vol. 89, No. 11, pp. 6943-4965.

* cited by examiner

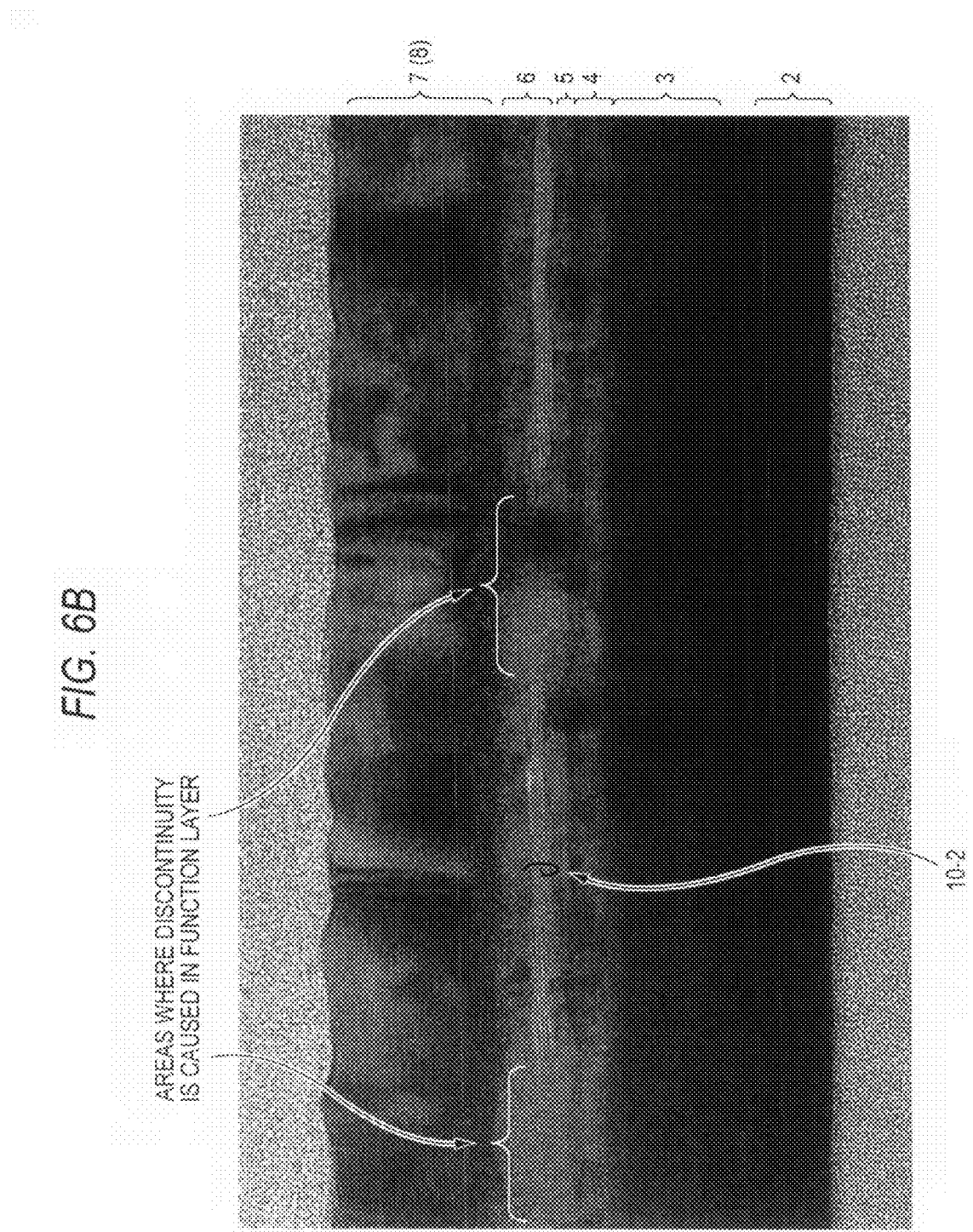

FIG. 12

[TABLE 1]

| ID | PROCESS FOR PREPARING FUNCTION LAYER | MR [%] |
|---|---|---|
| REF | NONE | 0.5 |
| A-1 | GROWTH OF AN Fe FILM TO 0.3 nm/NATURAL OXIDIZATION (THE AMOUNT OF OXYGEN USED FOR EXPOSURE: 4 kL) | 0.9 |
| A-2 | GROWTH OF AN Fe FILM TO 0.3 nm/IAO (AN ION BEAM VOLTAGE 100V, A BEAM CURRENT 50 mA, AND THE AMOUNT OF OXYGEN USED FOR EXPOSURE 1.5 kL) | 1.0 |
| A-3 | GROWTH OF AN Fe FILM TO 0.3 nm/PLASMA OXIDIZATION (AN RF PLASMA 300W, AND THE AMOUNT OF OXYGEN USED FOR EXPOSURE 1.5 kL) | 0.9 |
| A-4 | GROWTH OF AN Fe-O REACTIVE FILM TO 0.5 mm | 1.0 |
| B-1 | GROWTH OF AN Fe FILM TO 1 nm (THE AMOUNT OF OXYGEN USED FOR EXPOSURE IS 6 kL)/ NATURAL OXIDATION (THE AMOUNT OF OXYGEN USED FOR EXPOSURE IS 6 kL)/ AIT (A BEAM VOLTAGE 100V AND A BEAM CURRENT 50 mA) | 6.0 |
| B-2 | GROWTH OF AN Fe FILM TO 1 nm/IAO (A BEAM VOLTAGE OF 100V, A BEAM CURRENT OF 50 mA, AND THE AMOUNT OF OXYGEN USED FOR EXPOSURE IS 2 kL)/ AIT (A BEAM VOLTAGE 100V AND A BEAM CURRENT 50 mA) | 10.0 |
| B-3 | GROWTH OF AN Fe FILM TO 1 nm/PLASMA OXIDATION (RF PLASMA OF 20W, AND THE AMOUNT OF OXYGEN USED FOR EXPOSURE IS 2kL)/ AIT (A BEAM VOLTAGE OF 100V, AND A BEAM CURRENT OF 50 mA) | 9.0 |
| B-4 | CREATING AN Fe-O REACTIVE FILM TO 1.5 nm/ AIT (A BEAM VOLTAGE OF 100V, A BEAM CURRENT OF 50 mA) | 10.0 |

FIG. 13

[TABLE 2]

| ID | PROCESS FOR PREPARING FUNCTION LAYER | MR [%] |
|---|---|---|
| REF | NONE | 0.5 |
| C-1 | GROWTH OF AN Fe50Co50 FILM TO 0.3 nm/NATURAL OXIDIZATION (THE AMOUNT OF OXYGEN USED FOR EXPOSURE: 6kL) | 0.7 |
| C-2 | GROWTH OF AN Fe50Co50 FILM TO 0.3 nm/IAO (AN ION BEAM VOLTAGE 100V, A BEAM CURRENT 50 mA, AND THE AMOUNT OF OXYGEN USED FOR EXPOSURE 2kL) | 0.8 |
| C-3 | GROWTH OF AN Fe50Co50 FILM TO 0.3 nm/PLASMA OXIDIZATION (AN RF PLASMA 300W, AND THE AMOUNT OF OXYGEN USED FOR EXPOSURE 2kL) | 0.7 |
| C-4 | GROWTH OF A REACTIVE Fe50Co50-O FILM TO 0.5 nm | 0.8 |
| D-1 | GROWTH OF AN Fe50Co50 FILM TO 1 nm/ NATURAL OXIDIZATION (THE AMOUNT OF OXYGEN USED FOR EXPOSURE IS 8 kL)/ AIT (A BEAM VOLTAGE 100V AND A BEAM CURRENT 50 mA) | 5.0 |
| D-2 | GROWTH OF AN Fe50Co50 FILM TO 1 nm/IAO (A BEAM VOLTAGE 100V, A BEAM CURRENT 50 mA, THE AMOUNT OF OXYGEN USED FOR EXPOSURE 3 kL)/ AIT (A BEAM VOLTAGE 100V AND A BEAM CURRENT 50 mA) | 8.0 |
| D-3 | GROWTH OF AN Fe50Co50 FILM TO 1 nm/PLASMA OXIDATION \ (RF PLASMA OF 20W, AND THE AMOUNT OF OXYGEN USED FOR EXPOSURE IS 3 kL)/ AIT (A BEAM VOLTAGE OF 100V, AND A BEAM CURRENT OF 50 mA) | 7.0 |
| D-4 | CREATING AN Fe50Co50-O REACTIVE FILM TO 1.5 nm/ AIT (A BEAM VOLTAGE OF 100V, A BEAM CURRENT OF 50 mA) | 8.0 |

FIG. 14

[TABLE 3]

| ID | PROCESS FOR PREPARING FUNCTION LAYER | MR [%] |
|---|---|---|
| REF | NONE | 0.5 |
| E-1 | GROWTH OF A Ti FILM TO 0.3 nm/NATURAL OXIDIZATION (THE AMOUNT OF OXYGEN USED FOR EXPOSURE: 7 kL) | 0.8 |
| E-2 | GROWTH OF A Ti FILM TO 0.3 nm/IAO (AN ION BEAM VOLTAGE 100V, A BEAM CURRENT 50 mA, AND THE AMOUNT OF OXYGEN USED FOR EXPOSURE 3 kL) | 0.9 |
| E-3 | GROWTH OF A Ti FILM TO 0.3 nm/PLASMA OXIDIZATION (AN RF PLASMA 300W, AND THE AMOUNT OF OXYGEN USED FOR EXPOSURE 3 kL) | 0.8 |
| E-4 | GROWTH OF A Ti-O REACTIVE FILM TO 0.5 nm | 0.9 |
| F-1 | GROWTH OF A Ti FILM TO 1 nm/ NATURAL OXIDIZATION (THE AMOUNT OF OXYGEN USED FOR EXPOSURE IS 9 kL)/ AIT (A BEAM VOLTAGE 100V AND A BEAM CURRENT 50 mA) | 5.0 |
| F-2 | GROWTH OF A Ti FILM TO 1 nm/IAO (A BEAM VOLTAGE 100V, A BEAM CURRENT 50 mA, THE AMOUNT OF OXYGEN USED FOR EXPOSURE 4 kL)/ AIT (A BEAM VOLTAGE 100V AND A BEAM CURRENT 50 mA) | 9.0 |
| F-3 | GROWTH OF A Ti FILM TO 1 nm/PLASMA OXIDATION (RF PLASMA OF 20W, AND THE AMOUNT OF OXYGEN USED FOR EXPOSURE IS 4 kL)/ AIT (A BEAM VOLTAGE OF 100V, AND A BEAM CURRENT OF 50 mA) | 8.0 |
| F-4 | CREATING A Ti-O REACTIVE FILM TO 1.5 nm/ AIT (A BEAM VOLTAGE OF 100V, A BEAM CURRENT OF 50 mA) | 9.0 |

FIG. 15

[TABLE 4]

| ID | PROCESS FOR PREPARING FUNCTION LAYER | MR [%] |
|---|---|---|
| REF | NONE | 0.5 |
| G-1 | GROWTH OF A Zr FILM TO 0.3 nm/NATURAL OXIDIZATION (THE AMOUNT OF OXYGEN USED FOR EXPOSURE: 7 kL) | 0.9 |
| G-2 | GROWTH OF A Zr FILM TO 0.3 nm/IAO (AN ION BEAM VOLTAGE 100V, A BEAM CURRENT 50 mA, AND THE AMOUNT OF OXYGEN USED FOR EXPOSURE 3 kL) | 1.0 |
| G-3 | GROWTH OF A Zr FILM TO 0.3 nm/PLASMA OXIDIZATION (AN RF PLASMA 300W, AND THE AMOUNT OF OXYGEN USED FOR EXPOSURE 3 kL) | 0.9 |
| G-4 | GROWTH OF A Zr-O REACTIVE FILM TO 0.5 nm | 1.0 |
| H-1 | GROWTH OF A Zr FILM TO 1 nm/NATURAL OXIDIZATION (THE AMOUNT OF OXYGEN USED FOR EXPOSURE IS 9 kL)/ AIT (A BEAM VOLTAGE 100V AND A BEAM CURRENT 50 mA) | 6.0 |
| H-2 | GROWTH OF A Zr FILM TO 1 nm/IAO (A BEAM VOLTAGE 100V, A BEAM CURRENT 50 mA, THE AMOUNT OF OXYGEN USED FOR EXPOSURE 4 kL)/ AIT (A BEAM VOLTAGE 100V AND A BEAM CURRENT 50 mA) | 10.0 |
| H-3 | GROWTH OF A Zr FILM TO 1 NM/PLASMA OXIDATION (RF PLASMA OF 20W, AND THE AMOUNT OF OXYGEN USED FOR EXPOSURE IS 4 kL)/ AIT (A BEAM VOLTAGE OF 100V, AND A BEAM CURRENT OF 50 mA) | 9.0 |
| H-4 | CREATING A Zr-O REACTIVE FILM TO 1.5 nm/ AIT (A BEAM VOLTAGE OF 100V, A BEAM CURRENT OF 50 mA) | 10.0 |

FIG. 16

[TABLE 5]

| ID | PROCESS FOR PREPARING FUNCTION LAYER | MR [%] |
|---|---|---|
| REF | NONE | 0.5 |
| I-1 | GROWTH OF AN Fe FILM TO 0.15 nm AND A Zr FILM TO 0.15 nm/NATURAL OXIDIZATION (THE AMOUNT OF OXYGEN USED FOR EXPOSURE: 7 kL) | 1.0 |
| I-2 | GROWTH OF AN Fe FILM TO 0.15 nm AND A Zr FILM TO 0.15 nm/IAO (AN ION BEAM VOLTAGE 100V, A BEAM CURRENT 50 mA, AND THE AMOUNT OF OXYGEN USED FOR EXPOSURE 3 kL) | 1.2 |
| I-3 | GROWTH OF AN Fe FILM TO 0.15 nm AND A Zr FILM TO 0.15 nm/PLASMA OXIDIZATION (AN RF PLASMA 300W, AND THE AMOUNT OF OXYGEN USED FOR EXPOSURE 3 kL) | 1.1 |
| I-4 | GROWTH OF A Fe-Zr-O REACTIVE FILM TO 0.3 nm | 1.2 |
| J-1 | GROWTH OF AN Fe FILM TO 0.5 nm AND A Zr FILM TO 0.5 nm/NATURAL OXIDIZATION (THE AMOUNT OF OXYGEN USED FOR EXPOSURE IS 9 kL)/ AIT (A BEAM VOLTAGE 100V AND A BEAM CURRENT 50 mA) | 8.0 |
| J-2 | GROWTH OF AN Fe FILM TO 0.5 nm AND A Zr FILM TO 0.5 nm/IAO (A BEAM VOLTAGE 100V, A BEAM CURRENT 50 mA, THE AMOUNT OF OXYGEN USED FOR EXPOSURE 4 kL)/ AIT (A BEAM VOLTAGE 100V AND A BEAM CURRENT 50 mA) | 12.0 |
| J-3 | GROWTH OF AN Fe FILM TO 0.5 nm AND A Zr FILM TO 0.5 nm/PLASMA OXIDATION (RF PLASMA OF 20W, AND THE AMOUNT OF OXYGEN USED FOR EXPOSURE IS 4 kL)/ AIT (A BEAM VOLTAGE OF 100V, AND A BEAM CURRENT OF 50 mA) | 11.0 |
| J-4 | CREATING AN Fe-Zr-O REACTIVE FILM TO 1.5 nm/AIT (A BEAM VOLTAGE OF 100V, A BEAM CURRENT OF 50 mA) | 12.0 |

FIG. 17

[TABLE 6]

| | CONFIGURATION OF FREE LAYER | MR [%] | | |
|---|---|---|---|---|
| | | Co90Fe10 1.5 nm/ FUNCTION LAYER/ Co90Fe10 1.5 nm | Co90Fe10 3 nm | Co90Fe10 1 nm/ Ni80Fe20 3.5 nm/ |
| | NONE | 0.5 (= REF) | 0.5 (= REF) | 0.4 (= M-0) |
| METHOD FOR FORMING FUNCTION LAYER IN PIN LAYER | GROWTH OF AN Fe FILM TO 0.3 nm/NATURAL OXIDATION (THE AMOUNT OF OXYGEN USED FOR EXPOSURE 4 kL) | 0.9 (= A-1) | 0.7 (= K-1) | 0.7 (= M-1) |
| | GROWTH OF AN Fe FILM TO 0.3 nm/IAO (A BEAM VOLTAGE OF 100V, A BEAM CURRENT OF 50 mA, AND THE AMOUNT OF OXYGEN USED FOR EXPOSURE 1.5 kL) | 1.0 (= A-2) | 0.4 (= K-2) | 0.4 (= M-2) |
| | GROWTH OF AN Fe FILM TO 0.3 nm/PLASMA OXIDATION (RF PLASMA OF 300W, AND THE AMOUNT OF OXYGEN USED FOR EXPOSURE IS 1.5 kL) | 0.9 (=AP-3) | 0.5 (= K-3) | 0.5 (= M-3) |
| | GROWTH OF AN Fe-O REACTIVE FILM TO 0.5 nm | 1.0 (= A-4) | 0.5 (= K-4) | 0.5 (= M-4) |
| | GROWTH OF AN Fe GROWTH FILM TO 1 nm/ NATURAL OXIDATION (THE AMOUNT OF OXYGEN USED FOR EXPOSURE IS 6 KL)/ AIT (A BEAM VOLTAGE 100 V AND A BEAM CURRENT 50 mA) | 6.0 (= B-1) | 0.5 (= L-1) | 0.5 (= O-1) |
| | GROWTH OF AN Fe FILM TO 1 nm/IAO (A BEAM VOLTAGE OF 100V, A BEAM CURRENT OF 50 mA, AND THE AMOUNT OF OXYGEN USED FOR EXPOSURE 2 KL)/AIT (A BEAM VOLTAGE 100V AND A BEAM CURRENT 50 mA) | 10.0 (= B-2) | 5 (= L-2) | 5 (= O-2) |
| | GROWTH OF AN Fe FILM TO 1 nm/PLASMA OXIDATION (RF PLASMA 20W, THE AMOUNT OF OXYGEN USED FOR EXPOSURE 2 KL)/ AIT (A BEAM VOLTAGE 100V AND A BEAM CURRENT 50 mA) | 9.0 (= B-3) | 5 (= L-3) | 5 (= O-3) |
| | GROWTH OF AN Fe-O REACTIVE FILM TO 1.5 nm/AIT (A BEAM VOLTAGE 100V, A BEAM CURRENT 50 mA) | 10.0 (= B-4) | 5 (= L-4) | 5 (= O-4) |

FIG. 18

[TABLE 7]

| | SPACER | | MR [%] |
|---|---|---|---|
| | | Cu 3 nm | Al-O HAVING Cu METAL PATH |
| METHOD FOR FORMING FUNCTION LAYER IN PIN LAYER | NONE | 0.5 (=REF) | 5 (= P-0) |
| | GROWTH OF AN Fe FILM TO 0.3 nm/NATURAL OXIDATION (THE AMOUNT OF OXYGEN USED FOR EXPOSURE 4 kL) | 0.9 (= A-1) | 5.5 (= P-1) |
| | GROWTH OF AN Fe FILM TO 0.3 nm/IAO (A BEAM VOLTAGE OF 100V, A BEAM CURRENT OF 50 mA, AND THE AMOUNT OF OXYGEN USED FOR EXPOSURE 1.5 kL) | 1.0 (= A-2) | 6 (= P-2) |
| | GROWTH OF AN Fe FILM TO 0.3 nm/PLASMA OXIDATION (RF PLASMA OF 300W, AND THE AMOUNT OF OXYGEN USED FOR EXPOSURE IS 1.5 kL) | 0.9 (= A-3) | 5.5 (= P-3) |
| | GROWTH OF AN Fe-O REACTIVE FILM TO 0.5 nm | 1.0 (= A-4) | 6 (= P-4) |
| | GROWTH OF AN Fe GROWTH FILM TO 1 nm/NATURAL OXIDATION (THE AMOUNT OF OXYGEN USED FOR EXPOSURE IS 6 kL)/ AIT (A BEAM VOLTAGE 100V AND A BEAM CURRENT 50 mA) | 6.0 (= B-1) | 3.6 (= Q-1) |
| | GROWTH OF AN Fe FILM TO 1 nm/IAO (A BEAM VOLTAGE OF 100V, A BEAM CURRENT OF 50 mA, AND THE AMOUNT OF OXYGEN USED FOR EXPOSURE 2 kL)/ AIT (A BEAM VOLTAGE 100V AND A BEAM CURRENT 50 mA) | 10.0 (=B-2) | 60 (= Q-2) |
| | GROWTH OF AN Fe FILM TO 1 nm/PLASMA OXIDATION (RF PLASMA 20W, THE AMOUNT OF OXYGEN USED FOR EXPOSURE 2 kL)/ AIT (A BEAM VOLTAGE 100V AND A BEAM CURRENT 50 mA) | 9.0 (=B-3) | 55 (= Q-3) |
| | GROWTH OF AN Fe-O REACTIVE FILM TO 1.5 nm/ AIT (A BEAM VOLTAGE 100V, A BEAM CURRENT 50 mA) | 10.0 (=B-4) | 60 (= Q-4) |

FIG. 19

[TABLE 8]

| | | MR [%] | |
|---|---|---|---|
| | | DISTANCE FROM SPACER OF FUNCTION LAYER | |
| | | 1.5 nm | 0.7 nm |
| | SPACER/FREE LAYER HAVING PIN LAYER/RESISTANCE ADJUSTMENT LAYER | Co90Fe10 1.5 nm/ FUNCTION LAYER/ Co90Fe10 1.5 nm/ SPACE HAVING RESISTANCE ADJUSTMENT LAYER/ Co90Fe10 1.5 nm/ FUNCTION LAYER/ Co90Fe10 1.5 nm | Co90Fe10 2.3 nm/ FUNCTION LAYER/ Co90Fe10 0.7 nm/ SPACE HAVING RESISTANCE ADJUSTMENT LAYER/ Co90Fe10 0.7 nm/ FUNCTION LAYER/ Co90Fe10 2.3 nm |
| METHOD FOR FORMING FUNCTION LAYER IN PIN LAYER | NONE | 5 (= P-0) | 5 (= P-0) |
| | GROWTH OF AN Fe FILM TO 0.3 nm/NATURAL OXIDATION (THE AMOUNT OF OXYGEN USED FOR EXPOSURE 4 kL) | 5.5 (= P-1) | 7 (= R-1) |
| | GROWTH OF AN Fe FILM TO 0.3 nm/IAO (A BEAM VOLTAGE OF 100V, A BEAM CURRENT OF 50 mA, AND THE AMOUNT OF OXYGEN USED FOR EXPOSURE 1.5 kL) | 6 (= P-2) | 8 (= R-2) |
| | GROWTH OF AN Fe FILM TO 0.3 nm/PLASMA OXIDATION (RF PLASMA OF 300W, AND THE AMOUNT OF OXYGEN USED FOR EXPOSURE IS 1.5 kL) | 5.5 (= P-3) | 7 (= R-3) |
| | GROWTH OF AN Fe-O REACTIVE FILM TO 0.5 nm | 6 (= P-4) | 8 (= R-4) |
| | GROWTH OF AN Fe GROWTH FILM TO 1 nm/NATURAL OXIDATION (THE AMOUNT OF OXYGEN USED FOR EXPOSURE IS 6 kL)/AIT (A BEAM VOLTAGE 100V AND A BEAM CURRENT 50 mA) | 3.6 (= Q-1) | 5 (= S-1) |
| | GROWTH OF AN Fe FILM TO 1 nm/IAO (A BEAM VOLTAGE OF 100V, A BEAM CURRENT OF 50 mA, AND THE AMOUNT OF OXYGEN USED FOR EXPOSURE 2 kL)/ AIT (A BEAM VOLTAGE 100V AND A BEAM CURRENT 50 mA) | 60 (= Q-2) | 70 (= S-2) |
| | GROWTH OF AN Fe FILM TO 1 NM/PLASMA OXIDATION (RF PLASMA 20W, THE AMOUNT OF OXYGEN USED FOR EXPOSURE 2 kL)/ AIT (A BEAM VOLTAGE 100V AND A BEAM CURRENT 50 mA) | 55 (= Q-3) | 60 (= S-3) |
| | GROWTH OF AN Fe-O REACTIVE FILM TO 1.5 nm/ AIT (A BEAM VOLTAGE 100V, A BEAM CURRENT 50 mA) | 60 (= Q-4) | 70 (= S-4) |

FIG. 20

[TABLE 9]

| ID | POSITION OF FUNCTION LAYER | | MR [%] | |
|---|---|---|---|---|
| | | | INSIDE | INTERFACE |
| | NONE | | 0.5 (= REF) | |
| METHOD FOR FORMING FUNCTION LAYER | GROWTH OF AN Fe FILM TO 0.3 nm/NATURAL OXIDATION (THE AMOUNT OF OXYGEN USED FOR EXPOSURE 4 kL) | | 0.9 (= A-1) | 0.9 (= T-1) |
| | GROWTH OF AN Fe FILM TO 0.3 nm/IAO (A BEAM VOLTAGE OF 100V, A BEAM CURRENT OF 50 mA, AND THE AMOUNT OF OXYGEN USED FOR EXPOSURE 1.5 kL) | | 1.0 (= A-2) | 1.0 (= T-2) |
| | GROWTH OF AN FE FILM TO 0.3 nm/PLASMA OXIDATION (RF PLASMA OF 300W, AND THE AMOUNT OF OXYGEN USED FOR EXPOSURE IS 1.5 kL) | | 0.9 (= A-3) | 0.9 (= T-3) |
| | GROWTH OF AN Fe-O REACTIVE FILM TO 0.5 nm | | 1.0 (= A-4) | 1.0 (= T-4) |
| | GROWTH OF AN Fe GROWTH FILM TO 1 nm/ NATURAL OXIDATION (THE AMOUNT OF OXYGEN USED FOR EXPOSURE IS 6 KL)/ AIT (A BEAM VOLTAGE 100V AND A BEAM CURRENT 50 mA) | | 6.0 (= B-1) | 6.0 (= U-1) |
| | GROWTH OF AN Fe FILM TO 1 nm/IAO (A BEAM VOLTAGE OF 100V, A BEAM CURRENT OF 50 mA, AND THE AMOUNT OF OXYGEN USED FOR EXPOSURE 2 kL)/ AIT (A BEAM VOLTAGE 100V AND A BEAM CURRENT 50 mA) | | 10.0 (= B-2) | 10.0 (= U-2) |
| | GROWTH OF AN Fe FILM TO 1 nm/PLASMA OXIDATION (RF PLASMA 20W, THE AMOUNT OF OXYGEN USED FOR EXPOSURE 2 kL)/ AIT (A BEAM VOLTAGE 100V AND A BEAM CURRENT 50 mA) | | 9.0 (= B-3) | 9.0 (= U-3) |
| | GROWTH OF AN Fe-O REACTIVE FILM TO 1.5 nm/ AIT (A BEAM VOLTAGE 100V, A BEAM CURRENT 50 mA) | | 10.0 (= B-4) | 10.0 (= U-4) |

FIG. 21

[TABLE 10]

| ID | PROCESS FOR PREPARING BARRIER LAYER | MR [%] |
|---|---|---|
| V-1 | GROWTH OF AN Al FILM TO 0.5 nm/NATURAL OXIDIZATION (THE AMOUNT OF OXYGEN USED FOR EXPOSURE: 7 kL) | 20 |
| V-2 | GROWTH OF AN Al FILM TO 0.5 nm/IAO (AN ION BEAM VOLTAGE 100V, A BEAM CURRENT 50 mA, AND THE AMOUNT OF OXYGEN USED FOR EXPOSURE 3 kL) | 30 |
| V-3 | GROWTH OF AN Al FILM TO 0.5 nm/PLASMA OXIDIZATION (AN RF PLASMA 300W, AND THE AMOUNT OF OXYGEN USED FOR EXPOSURE 3 kL) | 30 |
| V-4 | GROWTH OF AN Al-O REACTIVE FILM TO 0.9 nm | 30 |
| W-1 | GROWTH OF AN Al FILM TO 1 nm/NATURAL OXIDIZATION (THE AMOUNT OF OXYGEN USED FOR EXPOSURE IS 9 kL)/AIT (A BEAM VOLTAGE 100V AND A BEAM CURRENT 50 mA) | 40 |
| W-2 | GROWTH OF AN Al FILM TO 1 nm/IAO (A BEAM VOLTAGE 100V, A BEAM CURRENT 50 mA, THE AMOUNT OF OXYGEN USED FOR EXPOSURE 4 kL)/AIT (A BEAM VOLTAGE 100V AND A BEAM CURRENT 50 mA) | 60 |
| W-3 | GROWTH OF AN Al FILM TO 1 nm/PLASMA OXIDATION (RF PLASMA OF 20W, AND THE AMOUNT OF OXYGEN USED FOR EXPOSURE IS 4 kL)/AIT (A BEAM VOLTAGE OF 100V, AND A BEAM CURRENT OF 50 mA) | 60 |
| W4 | CREATING AN Al-O REACTIVE FILM TO 1.5 nm/AIT (A BEAM VOLTAGE OF 100V, A BEAM CURRENT OF 50 mA) | 60 |

METHOD FOR MANUFACTURING MAGNETORESISTANCE EFFECT ELEMENT

RELATED APPLICATION(S)

The present disclosure relates to the subject matter contained in Japanese Patent Application No. 2006-032261 filed on Feb. 9, 2006, which is incorporated herein by reference in its entirety.

FIELD

The present invention relates to a method for manufacturing a magnetoresistance effect element having a structure of causing a flow of a sense current in a direction perpendicular to a film plane of a magnetoresistance effect film, as well as to a magnetoresistance effect element, a magnetoresistance effect head, a magnetic recording-and-reproducing apparatus, and a magnetic storage device.

BACKGROUND

There has hitherto been reported an example where, even when a ferromagnetic layer is not subjected to anti-ferromagnetic coupling in relation to Current-In-Plane (CIP)-Giant-Magnetoresistance (GMR) that is acquired by causing an electric current to flow through the surface of a multilayer film of a sandwich structure of [a ferromagnetic layer/a nonmagnetic layer/a ferromagnetic layer], a great magnetoresistance effect appears. Specifically, an alternating bias magnetic field is applied to one of two ferromagnetic layers with a nonmagnetic layer being sandwiched therebetween, to thus fix magnetization (the layer is called a "magnetization fixed layer" or a "pin layer"). The other ferromagnetic layer is reversely magnetized (called a "magnetization free layer" or a "free layer") by an external magnetic field (a signal magnetic field or the like). Thus, a relative angle between magnetizing directions of the two ferromagnetic layers arranged with a non-magnetic layer sandwiched therebetween is changed, whereby a great magnetic resistance effect is achieved. A multilayer of such a type is called a "spin valve". See the following related-art document 1 for detail.

Related-art document 1: "Phys. Rev. B45, 806(1992), J. Appl. Phys. 69, 4774 (1981)"

Since the spin valve can saturate magnetization at low magnetic field strength, the spin valve is suitable for use as an MR head. Although an MR head has already been put into practice, under present circumstances the rate of change in magnetic resistance of the MR head remains a maximum of about 20%. An MR element exhibiting a higher rate of change in magnetic resistance (hereinafter referred to as an "MR ratio") has been required.

A TMR (Tunneling MagnetoResistance) element utilizing a tunnel effect is mentioned as a candidate for such an MR element. However, such an effect is exhibited as a result of electrons tunneling through an insulation layer. Hence, the TMR element usually has high resistance. When the MR head has high resistance, there arises a problem of a magnetic head incorporated in a hard disk drive generating large noise. In order to reduce the resistance, the thickness of a barrier layer must be reduced. However, it is known that, when the barrier layer is made thin, a uniform MR head cannot be manufactured, so that the MR ratio is deteriorated by pin holes. In relation to the TMR element, difficulty is encountered in achieving compatibility between low resistance and a high MR ratio. In the TMR, an electric current is caused to flow in a direction perpendicular to the film plane, and hence recording density of the hard disk is increased. When the size of the TAR head is reduced, resistance is increased further, which makes the head difficult to use.

In contrast, a CPP (Current-Perpendicular-to-Plane)—GMR element is mentioned as a candidate, wherein a sense current is caused to flow in a direction perpendicular to the film plane of an element. In the GMR element, electrons conduct through metal to thus appear. Hence, the GMR element has an advantage of low resistance. However, in the case of the spin spine valve film, the resistance to vertical conduction of an electric current is small. Hence, it is considerably important to increase the resistance value of an area in the film that contributes to spin-dependent conduction, thereby increasing the amount of change in resistance.

In order to increase the amount of change in resistance; namely, to improve the magnetoresistance effect, there has been conceived a technique for inserting a resistance adjustment layer including an insulator into a film of the spin valve. See the following related-art document 2 for detail.

Related-art document 2: "J. Appl. Phys. 89, 6943 (2001), IEEE Trans. Magn. 38, 2277 (2002)"

The spin valve is formed from an area that subjects electrons to spin-dependent scattering (a magnetization fixed layer/a spacer layer/a magnetization free layer) and an area where the degree of spin-dependent scattering is low (a ground layer, an anti-ferromagnetic layer, a protective layer, and the like). Provided that the resistance of a former area is taken as Rsd and the resistance of the latter area is taken as Rsi, the magnetoresistance effect of the spin valve can be expressed as $\Delta Rsd/(Rsi+Rsd)$. As a result of attention being paid to an phenomenon of enhancing the magnetoresistance effect of the magnetoresistance effect becoming greater as Rsd is greater than Rsi, a resistance adjustment layer including an insulator is inserted as mentioned previously.

However, the enhancement of magnetoresistance effect solely achieved solely by the current confinement effect is limited. In order to further enhance the magnetoresistance effect, it is necessary to increase spin-dependent scattering factors of the magnetization fixed layer and those of the magnetization free layer. To this end, studies on half metal become active. Here, an expression "half metal" is generally defined as a magnetic material having the status density of only either up-spin electrons or down-spin electrons when the status of electrons in the vicinity of a Fermi level is viewed. When idealistic half metal can be materialized, there can be realized two statuses; namely, a state where resistance is infinite and another state where resistance is low, when the magnetization status of the magnetization fixed layer and the magnetization status of the magnetization free layer are anti-parallel to each other and when those are parallel to each other. Therefore, an infinite rate of change in MR can be achieved. In reality, even though thus far an idealistic state cannot be materialized, when a difference between the state density of up-spin electrons and the state density of down-spin electrons is greater than that achieved in the related-art material, remarkable and order-of-magnitude increases in the MR ratio are expected. However, half metal encounters a great problem of hindering commercialization. Specific problems are as follows. (1) In the case of perovskite-based half metal, an improvement in crystallinity is indispensable. However, in the case of a polycrystalline film employed in a magnetic head, an improvement in crystallinity is essentially impossible. (2) In general, a temperature at which a half metal characteristic can be maintained is low, and half metal hardly appears at room temperature. (3) There is the possibility of a half metal characteristic disappearing at an interface between different materials constituting a spacer layer interposed between the magnetization fixed layer and the magnetization free layer. Among them, problem (3) is fatal. Even when perfect half metal can be manufactured at room temperature, properties of half metal cannot be effectively utilized when a TMR film or a CPP-GMR film is formed by stacking half metal during formation of the spacer layer.

Incidentally, from the viewpoint of the magnetoresistance effect element, perfect half metal is not required. The essential requirement is an improvement in a ratio of spin polarization in the electrons conducting through the sense current; specifically, a ratio of spin polarization of electrons at Fermi level contributing to conduction. Proposed technique is to pay attention to the spin polarization ratio and to insert a function layer for modulating a band structure into the magnetization fixed layer and the magnetization free layer.

According to this technique, the function layer is formed from a very thin oxidation layer and the like. This means is based on a suggestion that, when an ultra-thin oxidation layer is inserted into the magnetization fixed layer or the magnetization free layer formed from metal, a spin is polarized in the vicinity of the interface. When the oxidation layer becomes thick, the resistance of an element is increased, and adverse effects, such as noise, are imposed on the element as in the case of a related-art TMR element. Accordingly, the oxidation layer is formed to a very-thin layer of the order of one atom, to thus enable an attempt to reduce resistance.

However, in general, when the function layer is formed to a thickness of the order of one atom layer as shown in FIG. 11, the function layer assumes the shape of an island, or a plurality of pin holes are opened. Thus, difficulty is encountered forming a uniform function layer. When holes are opened in the function layer, an electric current induced by electrons having passed through the holes turns into a shunt current, thereby ending in a failure to attain great spin-dependent scattering. As a result, the spin filtering effect is diminished. Accordingly, the function layer must be very thin and uniform.

SUMMARY

According to a first aspect of the invention, there is provided a method for manufacturing a magnetoresistance effect element having a magnetization fixed layer, a non-magnetic intermediate layer, and a magnetization free layer being sequentially stacked. The method includes: forming at least a part of a magnetic layer that is to become either one of the magnetization fixed layer and the magnetization free layer; forming a function layer including at least one of an oxide, a nitride, and a fluoride on the part of the magnetic layer; and removing a part of the function layer by exposing the function layer to either one of an ion beam and plasma irradiation.

According to a second aspect of the invention, there is provided a method for manufacturing a magnetoresistance effect element having a magnetization fixed layer, a non-magnetic insulating intermediate layer, and a magnetization free layer being sequentially stacked. The method includes: forming the non-magnetic insulating intermediate layer by one of an oxide, a nitride, and a fluoride; and removing a part of the non-magnetic insulating intermediate layer by exposing the non-magnetic insulating intermediate layer to either one of an ion beam and plasma irradiation.

BRIEF DESCRIPTION OF THE DRAWINGS

In the accompanying drawings:

FIGS. 6A and 6B shows a TEM image of the function layer prepared through process of the present invention and a TEM image of a function layer prepared through a related-art process, respectively;

FIG. 12 is a table showing process requirements for samples made in accordance with the embodiment;

FIG. 13 is a table showing process requirements for samples made in accordance with the embodiment;

FIG. 14 is a table showing process requirements for samples made in accordance with the embodiment;

FIG. 15 is a table showing process requirements for samples made in accordance with the embodiment;

FIG. 16 is a table showing process requirements for samples made in accordance with the embodiment;

FIG. 17 is a table showing results of measurement of the MR ratios for the samples;

FIG. 18 is a table showing results of measurement of the MR ratios for the samples;

FIG. 19 is a table showing results of measurement of the MR ratios for the samples;

FIG. 20 is a table showing a comparison between the magnitude of the MR ratio acquired in the samples of magnetoresistance effect element; and FIG. 21 is a table showing process requirements for samples made in accordance with the embodiment.

DETAILED DESCRIPTION OF THE EMBODIMENTS

Embodiments of the present invention will be described hereinbelow by reference to the accompanying drawings.

First Embodiment

Figure 1:
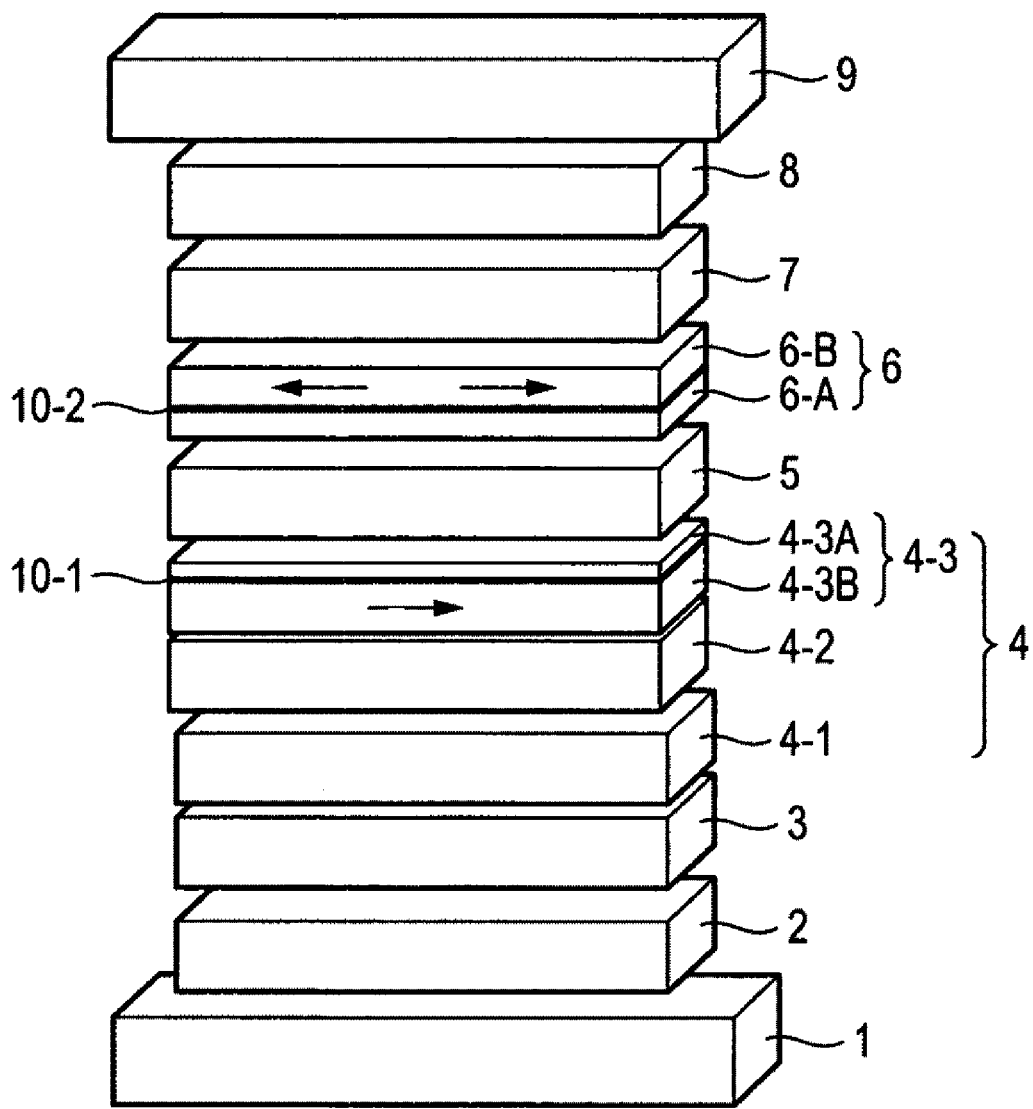
FIG. 1 is a structural drawing of a magnetoresistance effect element according to first through eighth embodiments of the present invention.
Figure 2A:
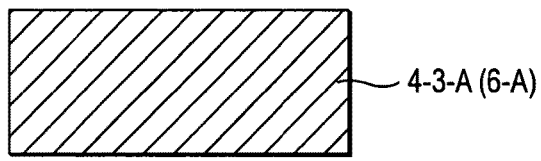
FIGS. 2A-2E are drawings pertaining to formation of a function layer and a barrier layer of the present invention.
Figure 2B:
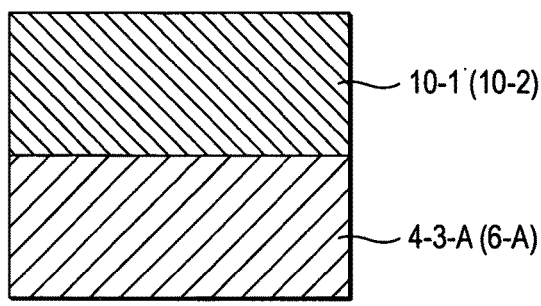
Figure 2C:
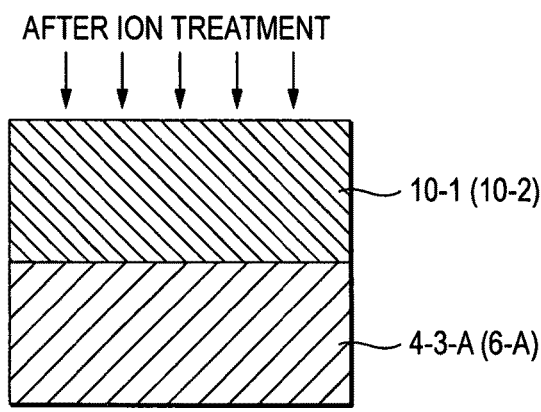
Figure 2D:
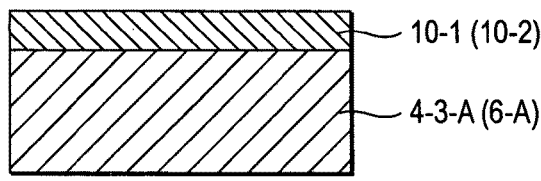
Figure 2E:
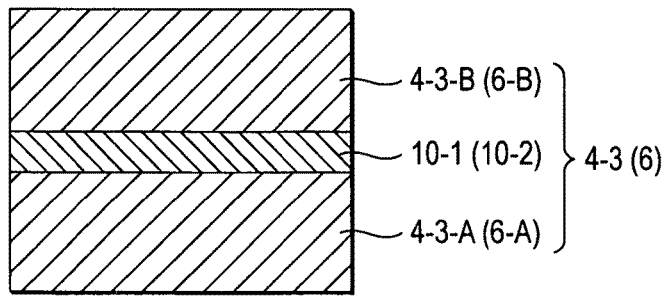

First, a magnetoresistance effect element manufactured by a manufacturing method of a first embodiment of the present invention will be described. FIG. 1 is a cross-sectional view of the magnetoresistance effect element manufactured by the manufacturing method of the present invention.

The magnetoresistance effect element shown in FIG. 1 has a structure formed by stacking a first electrode 1; a substrate layer 2 formed from a Ta layer having a thickness of 5 nm and an Ru layer having a thickness of 2 nm; an anti-ferromagnetic layer 3 formed from PtMn to a thickness of 15 nm or thereabouts; a magnetization fixed layer 4 including a first magnetization fixed layer 4-1 formed from a material of $Co_{90}Fe_{10}$ to a thickness of 3 to 4 nm or thereabouts, a magnetization anti-parallel bonding layer 4-2 formed from Ru to a thickness of about 0.9 nm, and a second magnetization fixed layer 4-3 bonded to the $Co_{90}Fe_{10}$ layer of about 1.5 nm with a function layer 10-1 sandwiched therebetween; a spacer layer 5 formed from Cu to a thickness of 3 nm or thereabouts; a magnetization free layer 6; a first protective layer 7; a second protective layer 8; and a second electrode 9.

Magnetization of the first magnetization fixed layer 4-1 is fixed essentially in one direction by an adjacent anti-ferromagnetic layer 3. Magnetization of the second magnetization fixed layer 4-3 is fixed in a direction anti-parallel to the first magnetization fixed layer via the magnetization anti-parallel coupling layer 4-2. The magnetization free layer 6 includes a ferromagnetic layer whose magnetization can change according to the external magnetic field. The spacer layer 5 is a layer which blocks magnetic coupling between the second magnetization fixed layer 4-3 and the magnetization free layer 6. In the magnetoresistance effect element shown in FIG. 1, the spacer layer 5 is formed from only metal.

The magnetoresistance effect element having the above configuration is manufactured as mentioned above. First, a Ta layer of 5 nm and an Ru layer of 2 nm are stacked on a material, such as Cu, NiFe, Ta, Ru, CuAg, or the like, which is to become the first electrode 1, by DC magnetron sputtering, to thus form the substrate layer 2.

PtMn, which is to become the anti-ferromagnetic layer 3, is formed on the substrate layer 2 to 15 nm, by DC magnetron sputtering without breaking the atmosphere under which the substrate layer 2 has been formed. After formation of the anti-ferromagnetic layer 3, $Co_{90}Fe_{10}$ is stacked to 3 to 4 nm on the anti-ferromagnetic layer 3, thereby forming the first magnetization fixed layer 4-1. As a result of Ru being stacked to 0.9 nm, the magnetization anti-parallel coupling layer 4-2 is formed. Subsequently, $Co_{90}Fe_{10}$—which is the stacked member; i.e., the second magnetization fixed layer 4-3—is stacked to 1.5 nm. During the course of formation of the second magnetization fixed layer 4-3, the function layer 10-1 is formed in the second magnetization fixed layer 4-3 by such a process as shown in FIGS. 2A-2E.

Specifically, the process is as follows. First, Fe is grown to a thickness of 1 nm as a portion of the second magnetization fixed layer 4-3 that is to become an oxidized layer. Here, the term "a portion of the second magnetization fixed layer 4-3" means a lower half of the second magnetization fixed layer that is split into upper and lower portions with the function layer 10 sandwiched therebetween.

The surface of Fe, which is a portion of the second magnetization fixed layer 4-3, is subjected to natural oxidation, ion beam oxidation (IAO: Ion Assisted Oxidation), or plasma oxidation, thereby causing a function layer 10-1 to grow to a thickness of about 1.5 nm to 3 nm on the surface of Fe. Here, IAO is a process for introducing oxygen into a chamber while exposing oxygen to an Ar ion beam to thus effect oxidation. See the following related-art document 3 for detail.

Related-art document 3: "J. Appl. Phys. 91, 6684 (2002)"

An ion beam is extremely weaker than that employed in ordinary milling requirements, and a beam voltage is set to 100V or less. An etch rate achieved when Fe is exposed to an ion beam without oxygen under these requirements is 0.1 to 3 angstrom/min. or thereabouts.

Process requirements for natural oxidation, IAO, and plasma oxidation are as provided in Table 1 shown in FIG. 12.

In Table 1, reference symbol REF denotes, as a sample to be referred to, a process for a spin valve structure having no function layer. Reference symbols A-1 to A-4 denote process conditions for a related-art process of preparing a function layer. Reference symbols B-1 to B-4 denote process conditions for a process of preparing a function layer of the present invention.

Figure 3:
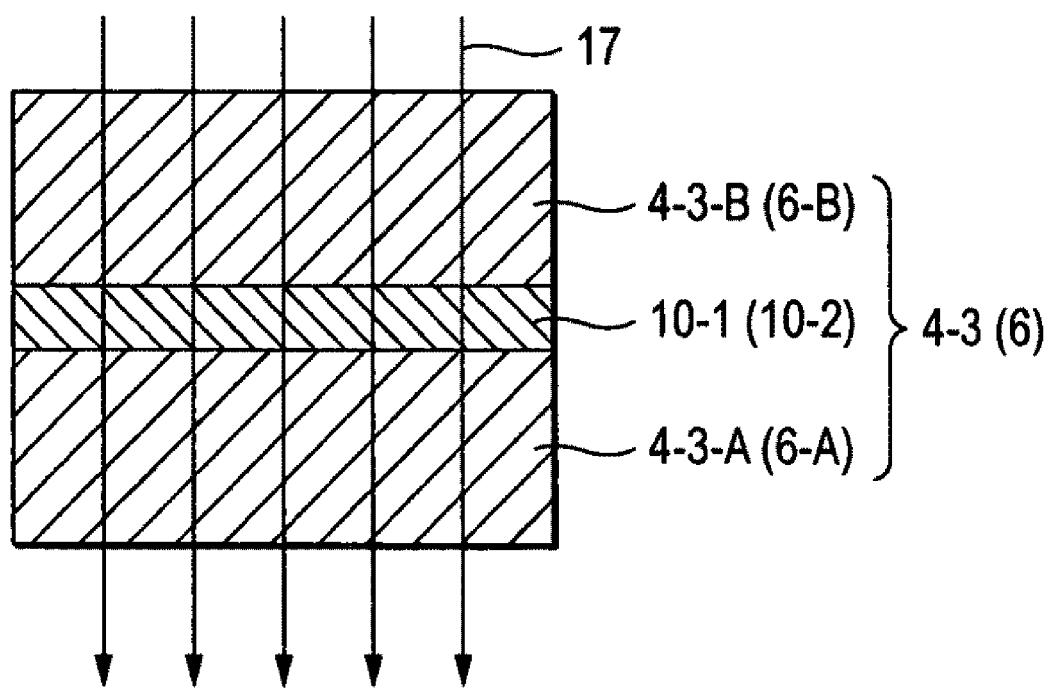
FIG. 3 is a view showing a spin filtering effect of the function layer prepared through a process of the present invention.
Figure 11:
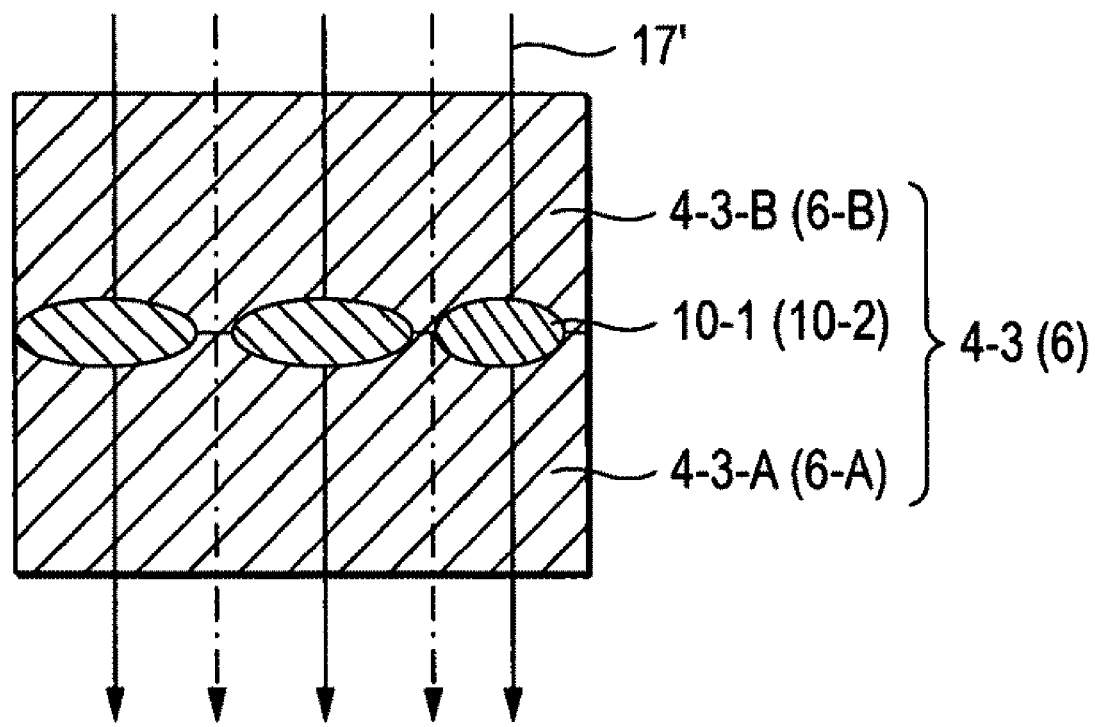
FIG. 11 is a view showing a spin filtering effect of the function layer prepared through a related-art process.

A difference between the process conditions for the conventional process of preparing a function layer and the process conditions for the process of the present invention for preparing a function layer lies in that AIT (After Ion Treatment); namely, irradiation of a weak ion beam, is performed when a thin oxide film is formed by any one of natural oxidation, IAO, and plasma oxidation. AIT is for forming a thin film from $Fe_{50}Co_{50}$—O by very weak milling. As in the case of previously-described IAO, very weak ion beam conditions are required in this case. For instance, when AIT is performed under the conditions of a beam voltage of 200V or more and a beam current of 100 mA or more, which are employed in a case where a thick film of the order of tens of nanometers is removed by milling, the uniform function layer 10 cannot be prepared as shown in FIG. 11; otherwise, a treated film surface becomes rough, which in turn reduces the MR ratio because the sense electron current 17 flows only partially through the function layer 10. AIT does not result in the function layer being formed into the shape of an island or a plurality of pin holes being formed in the function layer. An oxide film to become the function layer 10 can be formed into a thin film having a uniform thickness as shown in FIG. 3. In Result, the whole of current 17 can flow through the function layer 10, so the high MR ratio can be obtained.

After the function layer 10 has been formed by the above process, Co90Fe10 which is to form an upper half of the second magnetization fixed layer 4-3 is formed, thereby completing the second magnetization fixed layer 4-3. Next, the spacer layer 5 made from Cu is formed over the second magnetization fixed layer 4-3 to a thickness of 3 nm.

After formation of the spacer layer 5, the magnetization free layer 6 is formed. As in the case of the second magnetization fixed layer 4-3, the magnetization free layer 6 may include a function layer 10-2. A manufacturing process employed at this time is essentially the same as the process for manufacturing the second magnetization fixed layer 4-3, and hence its explanation is omitted.

After formation of the magnetization free layer 6, the first protective layer 7 made from Cu and the second protective layer 8 made from Ru are formed, while continually remaining under vacuum, by magnetron sputtering using a DC bias.

Finally, a material, such as Cu, NiFe, Ta, Ru, CuAg, or the like, is caused to grow on the surface of the second protective layer 8, thereby forming a second electrode 9. Through the above-mentioned processes, the magnetoresistance effect element is completed.

In the present embodiment, the function layer 10 is taken as an oxide of Fe. However, the function layer 10 is not limited to this material. The essential requirement for the function layer 10 is to be an oxide, a nitride, or a fluoride formed by oxidizing, nitriding, or fluorinating metal or an alloy containing at least one member selected from the group consisting of Fe, Co, Ni, Cu, Ti, V, Cr, Mn, Mg, Al, Si, Zr, Nb, Mo, Ru, Rh, Pd, Ag, Hf, Ta, W, Re, Ir, Pt, and Au.

A difference between the properties of the magnetoresistance effect element manufactured under the manufacturing method according to the first embodiment of the present invention and those of the magnetoresistance effect element manufactured under the conventional manufacturing method will now be described by reference to Table 1.

In Table 1, in A-1, A-2, A-3, and A-4, where the function layer 10 is formed through the related-art processes, an MR ratio is increased as compared with a sample REF where the function layer is not formed. However, a significant increase is not found. In contrast, in B-1, B-2, B-3, and B-4 that are samples where the function layer 10 is formed through the process of the present invention, corresponding to samples prepared through the processes of the present invention, the MR ratio is increased by a factor of ten. Thus, the advantage of the samples is noticeable. The reason for this is that a uniform function layer, such as that shown in FIG. 3, is considered to be formed in the samples B-1, B-2, B-3, and B-4, in contrast with the function layers of the samples A-1, A-2, A-3, and A-4 being formed into the shape of an island as shown in FIG. 11.

Figure 6A:
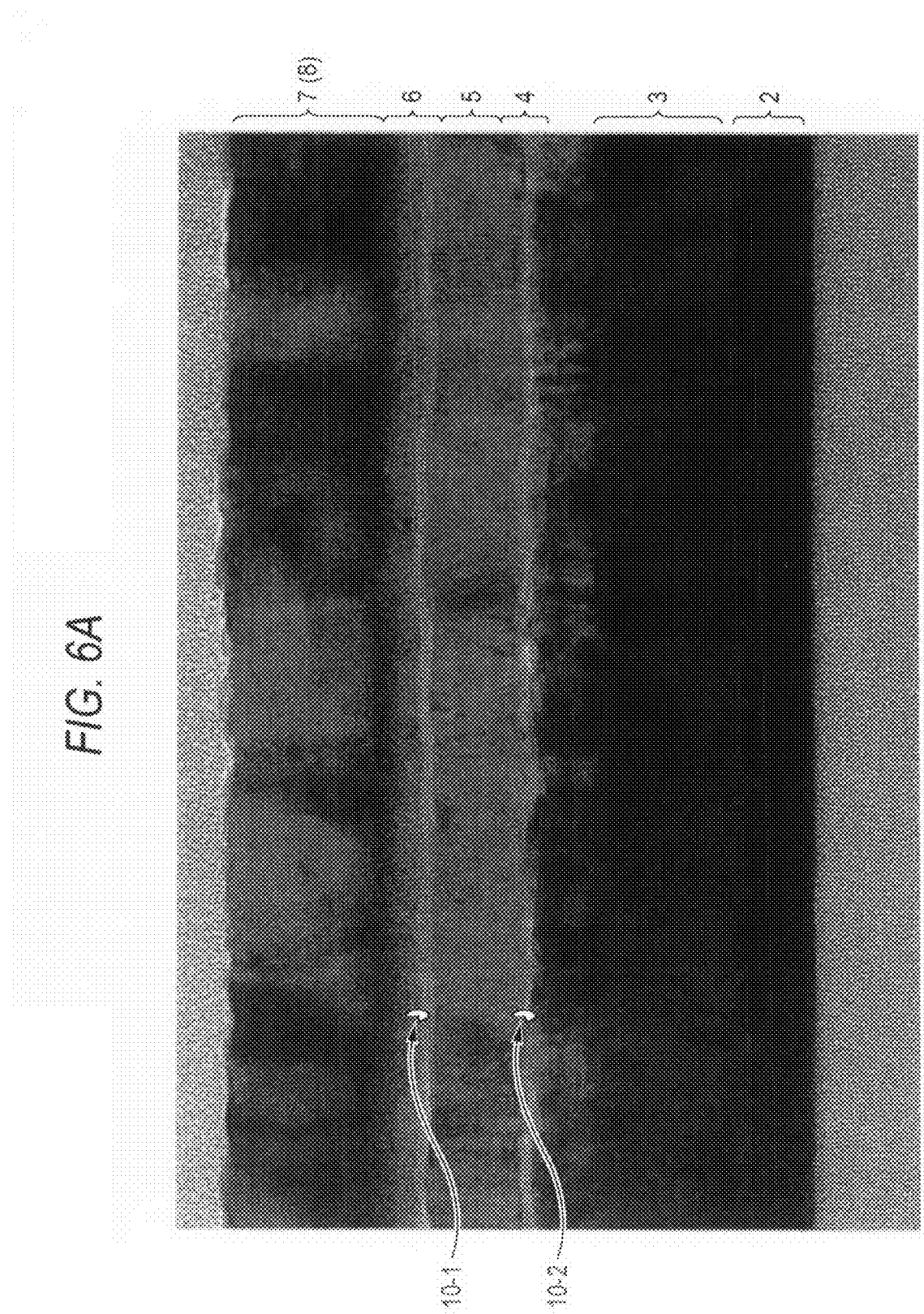

FIG. 6A shows a cross-sectional TEM (transmission electron microscope) image of an area in the vicinity of the function layers 10-2, 10-2 prepared through the process of the present invention. In the illustrated samples, the function layers 10-1, 10-2 are oxide layers, and hence contrast which is whiter than that of the surrounding areas is acquired. By the white contrast, a determination can be made as to whether or not the function layers are uniform or assume the shape of a fragmented island. As can be ascertained in FIG. 6A, even when the sample is sliced as thinly as possible in the direction of transmission of electrons, the function layers 10-1, 10-2, which are essentially straight, have no discontinuity, and are extremely thin. Meanwhile, FIG. 6B is a cross-sectional TEM of an area of the function layers 10-1, 10-2 prepared through related-art processes. In contrast with FIG. 6A, the function layers 10-1, 10-2 can be ascertained to have discontinuity.

In FIGS. 6A and 6B, the function layers 10-1, 10-2 are white and can be clearly distinguished from the other areas. When the function layers are difficult to distinguish, the function layers can also be identified by EDX (Energy Dispersive X-ray Spectroscopy) analysis employing a beam whose size is narrowed to 1 nm or thereabouts. In this case, measurement points are provided at intervals of 0.5 nm to 1 nm in the direction of growth of a film. The function layers can also be computed from a half-value width of the distribution of concentration of oxygen, nitride, phosphor, fluorine, or the like achieved when the distribution of an element is plotted with reference to the measurement positions.

Figure 7:
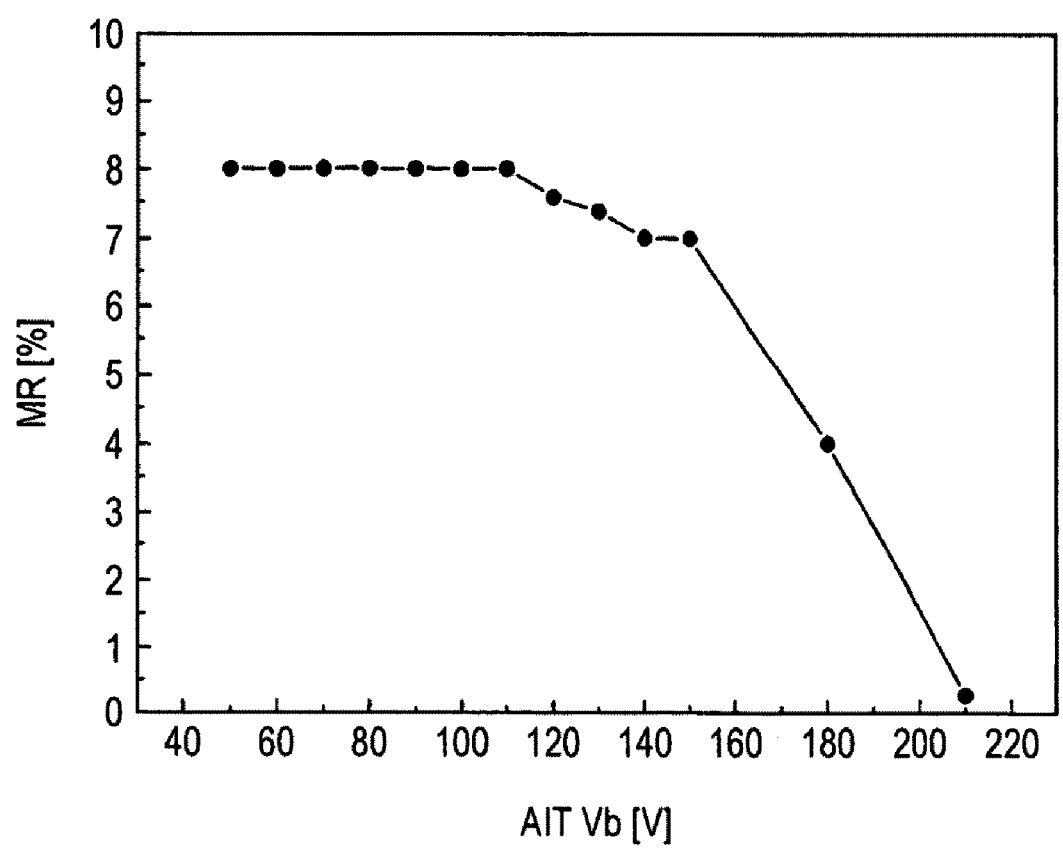
FIG. 7 is a graph showing a correlation between an applied voltage and an MR ratio in AIT treatment during the process of the present invention.

FIG. 7 shows a result acquired when conditions for AIT have been changed with respect to the sample B-2, which is a typical example process of the present invention. A processing time was adjusted and changed such that a film is formed to a thickness of 0.3 nm from $Fe_{50}Co_{50}$—O. As can be seen from the result, when the beam voltage has exceeded 110V, the MR ratio decreases. When the beam voltage is increased to 210V, the MR ratio is understood to assume a value of 0.3%, which is lower than the MR ratio achieved in the case of the sample REF having no function layer. From the result of this experiment, the beam voltage of AIT is preferably 110V or less.

Irradiation of RF plasma also requires very weak energy conditions. The energy is appropriately set to a range of 15 W to 30 W. In contrast, under the strong condition of 100 W or the like used for cleaning a substrate, the surface of the film is deteriorated, so that the MR ratio is decreased.

First Modification

Figure 4:
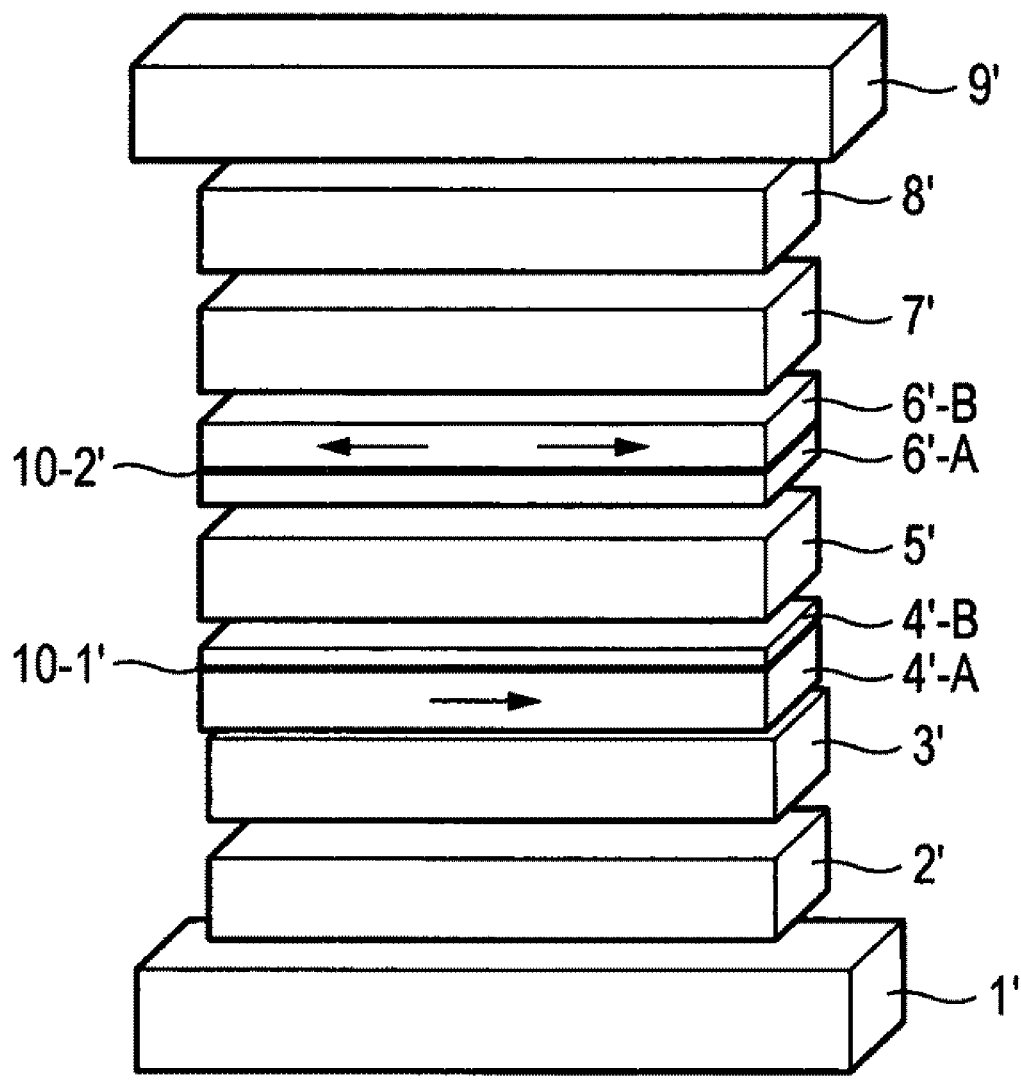
FIG. 4 is a structural drawing of a magnetoresistance effect element according to a first modification of the first embodiment of the present invention.

FIG. 4 shows a magnetoresistance effect element having a single magnetization fixed layer rather than a three-layer structure (a synthetic structure), as a first modification of the first embodiment illustrated in FIG. 1.

In FIG. 4, the magnetoresistance effect element of the present modification has a structure into which there are stacked a first electrode 1'; a substrate layer 2' including a layer of Ta having a thickness of 5 nm/a layer of Ru having a thickness of 2 nm; an anti-ferromagnetic layer 3' formed from PtMn to a thickness of 15 nm or thereabouts; a magnetization fixed layer 4' formed from a $Co_{90}Fe_{10}$ layer; a spacer layer 5' formed from Cu to a thickness of 3 nm or thereabouts; a magnetization free layer 6' formed from a layer of $Co_{90}Fe_{10}$; a first protective layer 7' formed from Cu to a thickness of about 1 nm; a second protective layer 8' formed from Ru to a thickness of about 5 nm; and a second electrode 9'. A function layer 10' is inserted into the magnetization fixed layer 4'.

Even in the first modification, an advantage similar to that achieved in the first embodiment is yielded.

Second Modification

Figure 5:
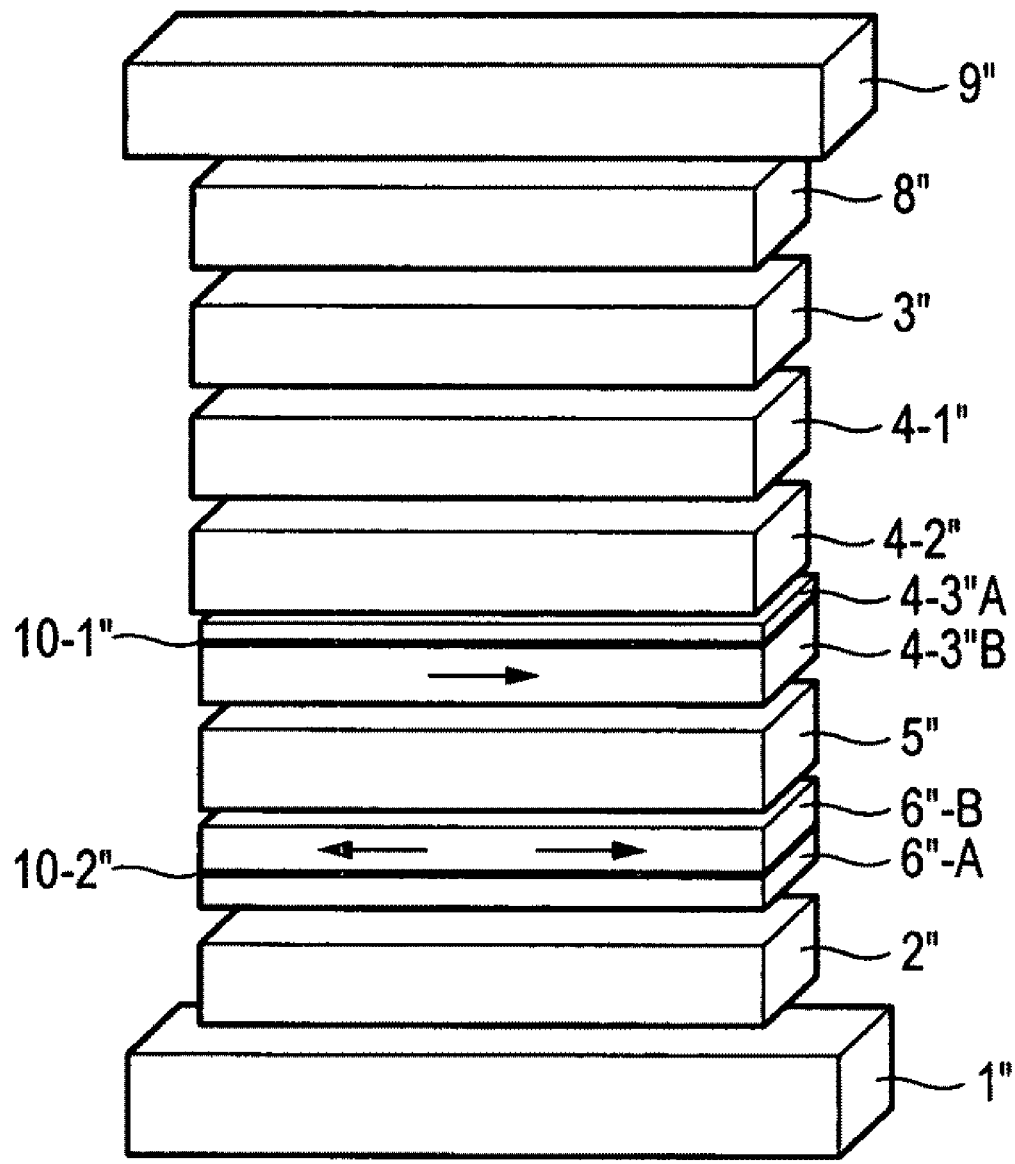
FIG. 5 is a structural drawing of a magnetoresistance effect element according to a second modification of the first embodiment of the present invention.

FIG. 5 shows a magnetoresistance effect element as a second modification of the first embodiment shown in FIG. 1, wherein the position of the magnetization fixed layer and that of the magnetization free layer are provided opposite, by way of the spacer layer, the position of the magnetization fixed layer and that of the magnetization free layer of the first embodiment shown in FIG. 1.

As shown in FIG. 5, a magnetoresistance effect element of the present modification has a structure where there are stacked a first electrode 1"; a substrate layer 2" formed from a layer of Ta having a thickness of 5 nm and a layer of Ru having a thickness of 2 nm; a magnetization free layer 6" formed by affixing a $Co_{90}Fe_{10}$ layer of 1.5 nm or thereabouts to the magnetization layer such that a function layer 10-2" is sandwiched therebetween; a spacer layer 5" formed from Cu to a thickness of 3 nm or thereabouts; a second magnetization fixed layer 4-3" formed by affixing a $Co_{90}Fe_{10}$ layer of 1.5 nm or thereabouts to the magnetization layer such that a function layer 10-1" is sandwiched therebetween; a magnetization anti-parallel coupling layer 4-2" formed from Ru to a thickness of about 0.9 nm; a first magnetization fixed layer 4-1" formed from $Co_{90}Fe_{10}$ to a thickness of about 3 to 4 nm; an anti-ferromagnetic layer 3" formed from PtMn to a thickness of about 15 nm; a protective layer 8" formed from Ru to a thickness of about 5 nm; and a second electrode 9". Even the second modification yields the same advantage as that yielded by the first embodiment.

Second Embodiment

A method for manufacturing a magnetoresistance effect element of a second embodiment of the present invention will now be described. The second embodiment is different from the first embodiment in that the material of the function layer is changed. Therefore, clear differences between the first and second embodiments are described, and explanations of similarities between them are omitted.

After the first electrode 1 to the magnetization anti-parallel coupling layer 4-2 have been formed through the processes described in the first embodiment, $Co_{90}Fe_{10}$—which is a stacked member and serves as a second magnetization fixed layer 4-3—is stacked to 1.5 nm. During the course of formation of the second magnetization fixed layer 4-3, the function layer 10-1 is formed through the process such as that shown in FIGS. 2A-2E.

Specifically, the processes are as follows. First, $Fe_{50}Co_{50}$ is grown to a thickness of 1 nm as a portion of the second magnetization fixed layer 4-3 that is to become an oxidized layer. Here, the term "a portion of the second magnetization fixed layer 4-3" means a lower half of the second magnetization fixed layer that is split into upper and lower portions with the function layer 10-1 sandwiched therebetween, as described in connection with the first embodiment.

The surface of $Fe_{50}Co_{50}$, which is a portion of the second magnetization fixed layer 4-3, is subjected to natural oxidation, ion beam oxidation (IAO: Ion Assisted Oxidation), or plasma oxidation, thereby causing the function layer 10-1 to grow to a thickness of about 1.5 nm to 3 nm on the surface of $Fe_{50}Co_{50}$. Here, an ion beam is extremely weaker than that employed in ordinary milling requirements, and a beam voltage is set to 100V or less. An etch rate achieved when $Co_{90}Fe_{10}$ is exposed to an ion beam without oxygen under these requirements is 3 angstrom/min. or thereabouts.

Process requirements for natural oxidization, IAO, and plasma oxidization are as provided in Table 2 shown in FIG. 13.

In Table 2, reference symbol REF denotes, as a sample to be referred, a process for a spin valve structure having no function layer. Reference symbols C-1 to C-4 denote process conditions for a conventional process of preparing a function layer. Reference symbols D-1 to D-4 denote process conditions for a process of preparing a function layer of the present invention.

A difference between the process conditions for the related-art process of preparing a function layer and the process conditions for the process of the present invention for preparing a function layer lies in that AIT (After Ion Treatment) is performed when a thin oxide film is formed by any one of natural oxidation, IAO, and plasma oxidation, as in the case of the first embodiment. As a result of AIT being performed, the function layer 10 can be formed, while maintaining a uniform thickness, into a thin layer without being formed into the shape of an island or having a plurality of pin holes.

Subsequent to formation of the function layer 10 through the above-described processes, processes from the process of forming $Co_{90}Fe_{10}$—which is to become an upper half of the second magnetization fixed layer 4-3—until the process of forming the second electrode 9 are the same as those of the first embodiment, and hence their explanations are omitted.

In the present embodiment, the function layer 10 is taken as an oxide of FeCo. However, the function layer 10 is not limited to this material as in the case of the first embodiment. The essential requirement for the function layer 10 is to be an oxide, a nitride, or a fluoride formed by oxidizing, nitriding, or fluorinating metal or an alloy containing at least one member selected from the group consisting of Fe, Co, Ni, Cu, Ti, V, Cr, Mn, Mg, Al, Si, Zr, Nb, Mo, Ru, Rh, Pd, Ag, Hf, Ta, W, Re, Ir, Pt, and Au.

Differences between the properties of the magnetoresistance effect element manufactured under the manufacturing method of the second embodiment of the present invention and the properties of the magnetoresistance effect element manufactured under the manufacturing method of the related-art manufacturing method will now be described by reference to Table 2. From Table 2, even when an FeCo alloy is used as a base material of the function layer 10, the amount of increase in MR acquired in the sample group C prepared according to the related-art process flow is not large. However, the amount of increase in MR acquired in the sample group D prepared according to the process flow of the present invention is very large. This is also conceived that the uniform function layer 10 is acquired in the group D.

When the magnetoresistance effect element is formed under the method of the second embodiment and when RF plasma is effected under the same conditions as those of the first embodiment; namely, a beam voltage of 100V or less, the effect of the function layer can be sufficiently utilized only when the RF power is set to 15 W to 30 W, and a high MR ratio can be acquired.

A higher MR ratio can be realized, so long as a $Co_{1-x}Fe_x$ alloy ($50 \leqq x \leqq 100$) including the composition of the first embodiment and that of the second embodiment is used.

Third Embodiment

A method for manufacturing a magnetoresistance effect element of a third embodiment of the present invention will now be described. The third embodiment is different from the function layer of the first embodiment in that the material of the function layer is changed as in the case of the second embodiment. Therefore, clear differences between the first and second embodiments are described, and explanations of similarities between them are omitted.

After the first electrode 1 to the magnetization anti-parallel coupling layer 4-2 have been formed through the processes described in the first embodiment, $Co_{90}Fe_{10}$—which is a stacked member and a second magnetization fixed layer 4-3—is stacked to 1.5 nm. During the course of formation of the second magnetization fixed layer 4-3, the function layer 10-1 is formed through the process such as that shown in FIGS. 2A-2E.

Specifically, the processes are as follows. First, Ti is grown to a thickness of 1 nm as a portion of the second magnetization fixed layer 4-3 that is to become an oxidized layer. Here, the term "a portion of the second magnetization fixed layer 4-3" means a lower half of the second magnetization fixed layer that is split into upper and lower portions with the function layer 10-1 sandwiched therebetween, as described in connection with the first embodiment.

The surface of Ti, which is a portion of the second magnetization fixed layer 4-3, is subjected to natural oxidation, ion beam oxidation (IAO), or plasma oxidation, thereby causing the function layer 10-1 to grow to a thickness of about 1.5 nm to 3 nm on the surface of Ti. Here, an ion beam is extremely weaker than that employed in ordinary milling requirements, and a beam voltage is set to 100V or less. An etch rate achieved when Ti is exposed to an ion beam without oxygen under these requirements is 0.1 to 3 angstrom/min. or thereabouts.

Process requirements for natural oxidization, IAO, and plasma oxidization are as provided in Table 3 shown in FIG. 14.

In Table 3, reference symbol REF denotes, as a sample to be referred to, a process for a spin valve structure having no function layer. Reference symbols E-1 to E-4 denote process conditions for a conventional process of preparing a function layer. Reference symbols F-1 to F-4 denote process conditions for a process of preparing a function layer of the present invention.

A difference between the process conditions for the related-art process of preparing a function layer and the process conditions for the process of the present invention for preparing a function layer lies in that AIT (After Ion Treatment) is performed when a thin oxide film is formed by any one of natural oxidation, IAO, and plasma oxidation, as in the case of the first embodiment. As a result of AIT being performed, the function layer 10 can be formed, while maintaining a uniform thickness, into a thin layer without being formed into the shape of an island or having a plurality of pin holes.

Subsequent to formation of the function layer 10 through the above-described processes, processes from the process of forming $Co_{90}Fe_{10}$—which is to become an upper half of the second magnetization fixed layer 4-3—until the process of forming the second electrode 9 are the same as those of the first embodiment, and hence their explanations are omitted.

In the present embodiment, the function layer 10 is taken as an oxide of Ti. However, the function layer 10 is not limited to this material. The essential requirement for the function layer 10 is to be an oxide, a nitride, or a fluoride formed by oxidizing, nitriding, or fluorinating metal or an alloy containing at least one member selected from the group consisting of Fe, Co, Ni, Cu, Ti, V, Cr, Mn, Mg, Al, Si, Zr, Nb, Mo, Ru, Rh, Pd, Ag, Hf, Ta, W, Re, Ir, Pt, and Au.

Differences between the properties of the magnetoresistance effect element manufactured under the manufacturing method of the third embodiment of the present invention and the properties of the magnetoresistance effect element manufactured under the manufacturing method of the related-art manufacturing method will now be described by reference to Table 3. Even when Ti is used as a base material of the function layer, the amount of increase in MR in sample group E prepared according to the related-art process flow is not large. However, the amount of increase in MR in the sample group F prepared through the process flow of the present invention is very large. It is also conceivable that a uniform function layer is obtained in group F.

When the magnetoresistance effect element is formed under the method of the third embodiment and when RF plasma is effected under the same conditions as those of the first embodiment; namely, a beam voltage of 100V or less, the effect of the function layer can be sufficiently utilized only when the RF power is set to 15 W to 30 W, and a high MR ratio can be acquired.

Fourth Embodiment

A method for manufacturing a magnetoresistance effect element of a fourth embodiment of the present invention will now be described. The fourth embodiment is different from the function layer 10 of the first embodiment in that the material of the function layer is changed as in the case of the second embodiment. Therefore, clear differences between the first embodiment and the fourth embodiment are described, and explanations of similarities between them are omitted.

After the first electrode 1 to the magnetization anti-parallel coupling layer 4-2 have been formed through the processes described in the first embodiment, $Co_{90}Fe_{10}$—which is a stacked member and a second magnetization fixed layer 4-3—is stacked to 1.5 nm. During the course of formation of the second magnetization fixed layer 4-3, the function layer 10-1 is formed through the process such as that shown in FIGS. 2A-2E.

Specifically, the processes are as follows. First, Ti is grown to a thickness of 1 nm as a portion of the second magnetization fixed layer 4-3 that is to become an oxidized layer. Here, the term "a portion of the second magnetization fixed layer 4-3" means a lower half of the second magnetization fixed layer that is split into upper and lower portions with the function layer 10-1 sandwiched therebetween, as described in connection with the first embodiment.

The surface of Zr, which is a portion of the second magnetization fixed layer 4-3, is subjected to natural oxidation, ion beam oxidation (IAO), or plasma oxidation, thereby causing the function layer 10-1 to grow to a thickness of about 1.5 nm to 3 nm on the surface of Zr. Here, an ion beam is extremely weaker than that employed in ordinary milling requirements, and a beam voltage is set to 100V or less. An etch rate achieved when Ti is exposed to an ion beam without oxygen under these requirements is 0.1 to 3 angstrom/min. or thereabouts.

Process requirements for natural oxidization, IAO, and plasma oxidization are as provided in Table 4 shown in FIG. 15.

In Table 4, reference symbol REF denotes, as a sample to be referred to, a process for a spin valve structure having no function layer. Reference symbols G-1 to G-4 denote process conditions for a conventional process of preparing a function layer. Reference symbols H-1 to H-4 denote process conditions for a process of preparing a function layer of the present invention.

As in the case of the first embodiment, a difference between the process conditions for the related-art process of preparing a function layer and the process conditions for the process of the present invention for preparing a function layer lies in that AIT (After Ion Treatment) is performed when a thin oxide film is formed by any one of natural oxidation, IAO, and plasma oxidation. As a result of AIT being performed, the function layer 10 can be formed, while maintaining a uniform thickness, into a thin layer without being formed into the shape of an island or having a plurality of pin holes.

Subsequent to formation of the function layer 10 through the above-described processes, processes from the process of forming $Co_{90}Fe_{10}$—which is to become an upper half of the second magnetization fixed layer 4-3—until the process of forming the second electrode 9 are the same as those of the first embodiment, and hence their explanations are omitted.

In the present embodiment, the function layer 10 is taken as an oxide of Zr. However, the function layer 10 is not limited to this material. The essential requirement for the function layer 10 is to be an oxide, a nitride, or a fluoride formed by oxidizing, nitriding, or fluorinating metal or an alloy containing at least one member selected from the group consisting of Fe, Co, Ni, Cu, Ti, V, Cr, Mn, Mg, Al, Si, Zr, Nb, Mo, Ru, Rh, Pd, Ag, Hf, Ta, W, Re, Ir, Pt, and Au.

Differences between the properties of the magnetoresistance effect element manufactured under the manufacturing method of the fourth embodiment of the present invention and the properties of the magnetoresistance effect element manufactured under the manufacturing method of the related-art manufacturing method will now be described by reference to Table 4. Even when Zr is used as a base material of the function layer, the amount of increase in MR in sample group G prepared according to the related-art process flow is not large. However, the amount of increase in MR in the sample group H prepared through the process flow of the present invention is very large. It is also conceivable that a uniform function layer is obtained in group H.

When the magnetoresistance effect element is formed under the method of the fourth embodiment and when RF plasma is effected under the same conditions as those of the first embodiment; namely, a beam voltage of 100V or less, the effect of the function layer can be sufficiently utilized only when the RF power is set to 15 W to 30 W, and a high MR ratio can be acquired.

From the first through fourth embodiments, the thin-film formation process shown in FIGS. 2A-2E is shown to be useful as the method for manufacturing the function layers 10 of various materials. In addition, even when Ti, Cr, Zr, Hf, V, Al, Mg, or Cu is used for the function layer 10, a uniform function layer is understood to be acquired by causing the material to pass through the thin-film formation process in the same manner, and a high MR ratio is understood to be obtained.

Fifth Embodiment

A method for manufacturing a magnetoresistance effect element of a fifth embodiment of the present invention will now be described. The fifth embodiment is different from the first through fourth embodiments in that the function layer 10 is formed as a stacked member. In other respects, the fifth embodiment is essentially identical with the first through fourth embodiments, and hence clear differences between the fifth embodiment and the first through fourth embodiments are described, and explanations of similarities among them are omitted.

After the first electrode 1 to the magnetization anti-parallel coupling layer 4-2 have been formed through the processes described in the first embodiment, $Co_{90}Fe_{10}$—which is a stacked member and a second magnetization fixed layer 4-3—is stacked to 1.5 nm. During the course of formation of the second magnetization fixed layer 4-3, the function layer 10-1 is formed through the process such as that shown in FIGS. 2A-2E.

Specifically, the processes are as follows. First, Fe is grown to a thickness of 0.15 nm as a portion of the second magnetization fixed layer 4-3 that is to become an oxidized layer; and, subsequently, Zr is grown to a thickness of 0.15 nm. Here, the term "a portion of the second magnetization fixed layer 4-3" means a lower half of the second magnetization fixed layer that is split into upper and lower portions with the function layer 10-1 sandwiched therebetween, as described in connection with the first embodiment.

Fe and Zr, which are portions of the second magnetization fixed layer 4-3, are subjected to natural oxidation, ion beam oxidation (IAO), or plasma oxidation, thereby causing the function layer 10-1 to grow to a thickness of about 1.5 nm to 3 nm on the surface of Fe and Zr. Here, an ion beam is extremely weaker than that employed in ordinary milling requirements, and a beam voltage is set to 100V or less. An etch rate achieved when a multilayer body consisting of Fe and Zr is exposed to an ion beam without oxygen under these requirements is 0.1 to 3 angstrom/min. or thereabouts.

Process requirements for natural oxidization, IAO, and plasma oxidization are as provided in Table 5 shown in FIG. 16.

In Table 5, reference symbol REF denotes, as a sample to be referred to, a process for a spin valve structure having no function layer. Reference symbols I-1 to I-4 denote process conditions for a related-art process of preparing a function layer. Reference symbols J-1 to J-4 denote process conditions for a process of preparing a function layer of the present invention.

As in the case of the first embodiment, a difference between the process conditions for the related-art process of preparing a function layer and the process conditions for the process of the present invention for preparing a function layer lies in that AIT (After Ion Treatment) is performed when a thin oxide film is formed by any one of natural oxidation, IAO, and plasma oxidation. As a result of AIT being performed, the function layer 10 can be formed, while maintaining a uniform thickness, into a thin layer without being formed into the shape of an island or having a plurality of pin holes.

Subsequent to formation of the function layer 10 through the above-described processes, processes from the process of forming $Co_{90}Fe_{10}$—which is to become an upper half of the second magnetization fixed layer 4-3—until the process of forming the second electrode 9 are the same as those of the first embodiment, and hence their explanations are omitted.

In the present embodiment, the function layer 10 is taken as an oxide of Fe—Zr. However, the function layer 10 is not limited to this material. The essential requirement for the function layer 10 is to be an oxide, a nitride, or a fluoride formed by oxidizing, nitriding, or fluorinating metal or an alloy containing at least one member selected from the group consisting of Fe, Co, Ni, Cu, Ti, V, Cr, Mn, Mg, Al, Si, Zr, Nb, Mo, Ru, Rh, Pd, Ag, Hf, Ta, W, Re, Ir, Pt, and Au.

Differences between the properties of the magnetoresistance effect element manufactured under the manufacturing method of the fifth embodiment of the present invention and the properties of the magnetoresistance effect element manufactured under the manufacturing method of the related-art manufacturing method will now be described by reference to Table 5. Even when Zr is used as a base material of the function layer, the amount of increase in MR in sample group I prepared according to the related-art process flow is not large. However, the amount of increase in MR in the sample group J prepared through the process flow of the present invention is very large. It is also conceivable that a uniform function layer is obtained in group J. Further, since the function layer 10 is a multilayer body, there is achieved an MR which is greater than that achieved in the second and third embodiments where the function layer 10 is formed as a single layer. The reason for this is considered to be that modulation of the electron structure of the function layer 10 induces somewhat spin polarization effect in conduction electrons, thereby yielding a great spin filtering effect.

Even in the present embodiment, in a case where AIT is used for the thin film formation process, when RF plasma is effected under the same conditions as those of the first embodiment; namely, a beam voltage of 100V or less, the effect of the function layer can be sufficiently utilized only when the RF power is set to 15 W to 30 W, and a high MR ratio can be acquired.

The combination of stacked members of the present embodiment is not limited to the example mentioned above. A stacked member can yield the same advantage as that yielded in the present embodiment, so long as the stacked member is formed from two types of materials selected from Ti, Cr, Zr, Hf, V, Al, Mg, and Cu.

Sixth Embodiment

In the first through fifth embodiments, the function layer is assumed to be included in either the magnetization fixed layer or the magnetization free layer or both. The sixth embodiment examines the degree of difference between the MR ratio achieved when the function layer is included in either the magnetization fixed layer or the magnetization free layer and the MR ratio achieved when the function layer is included in both the magnetization fixed layer and the magnetization free layer.

A characteristic required by the magnetoresistance effect element is a magnetic characteristic as well as the rate of a change in resistance. Particularly, when an increase has arisen in the coercive force Hc and the magnetostriction λ of the magnetization free layer, the magnetic characteristic becomes the source of noise, or a response to an external magnetic field which is a signal becomes deteriorated. When the element is used as a magnetic head, a signal-to-noise ratio is lost. Accordingly, Hc and λ of the magnetization free layer must be minimized. In general, when a ferromagnetic substance is mixed with oxygen, Hc and λ are known to increase. Since the function layer of the present invention is chiefly formed from an oxygen layer, there is a possibility of Hc and λ increasing when the function layer is inserted into the magnetization free layer, thereby deteriorating the signal-to-noise ratio. However, in connection with a loss induced by the deterioration of the magnetic characteristic and an improvement in MR, when an advantage of improvement in MR is great, no problem arises even when the function layer is inserted into the magnetization free layer. In addition, there is an advantage of a configuration where the function layer is inserted solely into the magnetization free layer being readily realized in reality.

As an example, on the premise that the function layer is in the magnetization fixed layer in the first embodiment, separate consideration is given to a case where the function layer is in the magnetization free layer and a case where the function layer is not in the magnetization free layer. Table 6, shown in FIG. 17, shows results of measurement of the MR ratios. Incidentally, Table 6 also shows a configuration ($Co_{90}Fe_{10}$ 1 nm/$Ni_{80}Fe_{20}$ 3.5 nm) where the magnetic characteristics of the free layer become better.

According to Table 6, as in the case of the results of the first through sixth embodiments, the samples (B-1 to B-4, L-1 to L-4, O-1 to O-4) that have undergone AIT when a thin oxide film is formed in the magnetization fixed layer by any one of natural oxidation, IAO, and plasma oxidation are understood to be higher in MR ratio than the samples (A-1 to A-4, K-1 to K-4, M-1 to M-4) having not undergone AIT. As is evident from a comparison between A-2 and K-2, and between M-2, B-1 and L-1, O-1, the effect of an improvement in MR ratio considerably decreases when the function layer is inserted solely into the magnetization fixed layer.

By a comparison among the sample groups B-1 to B-4, L-1 to L-4, and O-1 to O-4 and a comparison among the sample groups A-1 to A-4, K-1 to K-4, and M-1 to M-4, the samples into which the function layer is inserted into the magnetization free layer can exhibit a greater spin filtering effect. Accordingly, a greater MR ratio can be acquired.

Seventh Embodiment

In the magnetoresistance effect elements described in connection with the first through sixth embodiments, the spacer layer 5 is formed from Cu. In the seventh embodiment, a study has been conducted as to whether or not the advantage of the present invention is yielded by a magnetoresistance effect element having a resistance adjustment layer as the spacer layer 5. The resistance adjustment layer employed herein is an NOL (Nano Oxide Layer) formed from an Al—O having a metal path made of Cu. The Cu metal path passes through the Al—O which is an insulating portion, and connects the magnetization fixed layer to the magnetization free layer in an ohmic manner.

Figure 9:
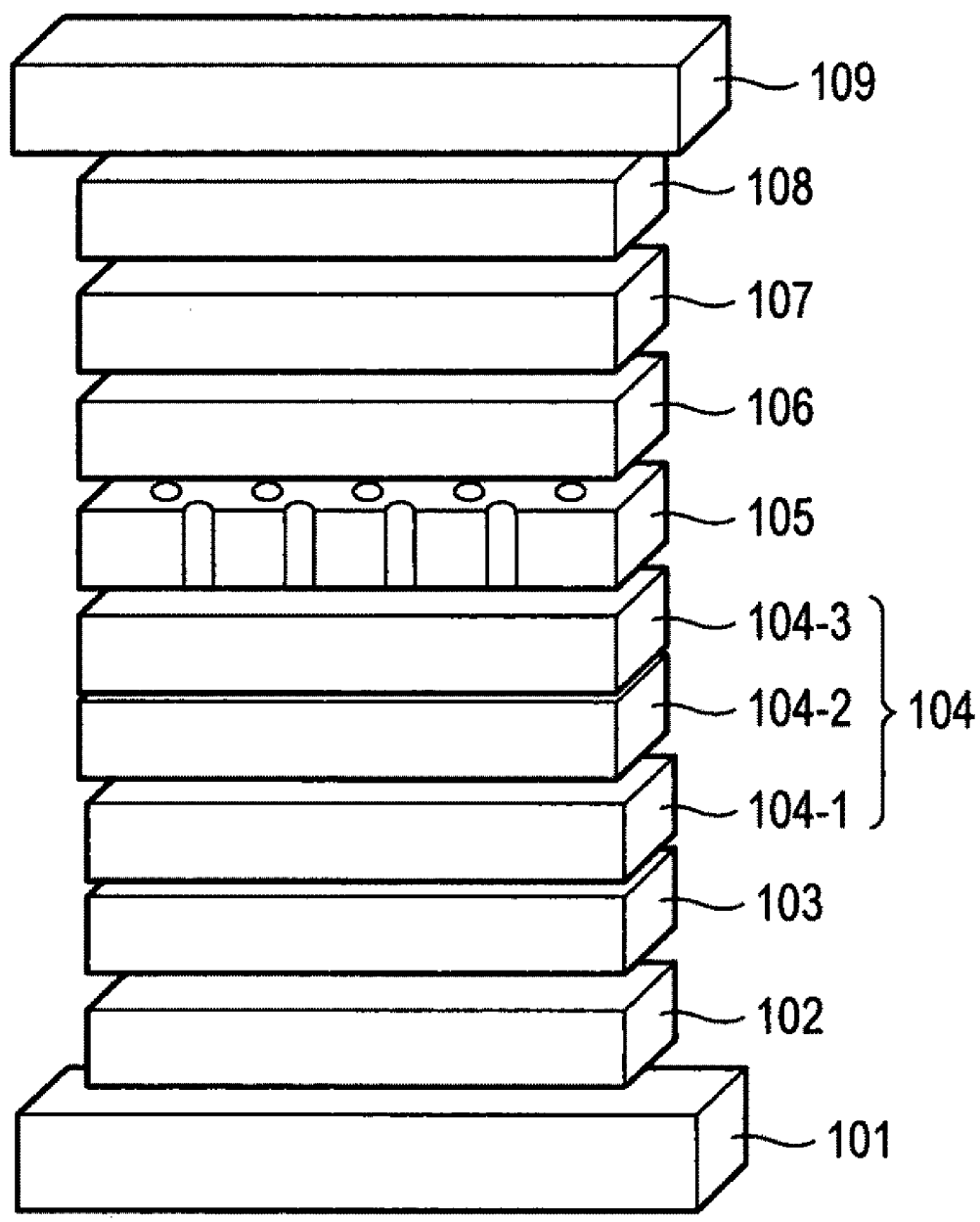
FIG. 9 is a structural drawing of a magnetoresistance effect element according to a seventh embodiment of the present invention.

A conceptual rendering of the magnetoresistance effect element of the seventh embodiment is shown in FIG. 9. The structure of the seventh embodiment exhibits a so-called CCP (Current-Confined Path) effect, wherein an electric current is confined in the vicinity of the magnetization fixed layer 104, the spacer layer 105, and the free layer 106, which are dependent on a spin. Hence, an MR ratio is increased. As an example, Table 7, shown in FIG. 18, shows a result of measurement of MR ratio in the magnetoresistance effect element in which the function layers described in connection with the first through fifth embodiments and the spacer layer of the Al—NOL structure having a Cu metal path are combined together.

According to Table 7, the MR ratios of the magnetoresistance effect elements (P-1 to P-4, and Q-1 to Q-4), each having a spacer layer 105 of an Al—NOL structure having a Cu metal path, are about six to seven times as large as the MR ratios (achieved by the elements A-1 to A-4, and B-1 to B-4), each of which has the structure described in connection with the first through fifth embodiments.

As above, the magnetoresistance effect element having the spacer layer 105 of Al—NOL structure with the Cu metal path can also maintain the advantage of the present invention; namely, an improvement in the MR ratio realized by the function layer formed by subjecting the magnetization fixed layer and the magnetization free layer to oxidation and AIT treatment.

Eighth Embodiment

In the first through sixth embodiment, the position of the function layer is assumed to be located in the vicinity of an essentially-intermediate position between the magnetization fixed layer and the magnetization free layer. However, the spin filtering effect in the magnetization fixed layer or the magnetization free layer ought to be achieved equally everywhere.

However, in the case of the magnetoresistance effect element having a resistance adjustment layer in the spacer as shown in the seventh embodiment, the current confined effect becomes greater as the distance to the spacer becomes smaller. Accordingly, an increase in a spin-dependent scattering phenomenon achieved in the vicinity of the interface between the magnetization fixed layer and the magnetization free layer is greatly significant. Therefore, the positional dependence of the function layer on the magnetization fixed layer and the magnetization free layer will now be examined.

As a comparative example, the MR ratio of the magnetoresistance effect element where the function layer is located at the position (a distance 1.5 nm from the interface) between the magnetization fixed layer and the magnetization free layer in the seventh embodiment is compared with the MR ratio of the magnetoresistance effect element having a configuration where the function layer of the present embodiment is located at a position (0.7 nm from the interface). A result of comparison is provided in Table 8 shown in FIG. 19.

As is also evident from Table 8, the MR ratios achieved in the sample R group and those acquired in the S group can be ascertained to be greater than the MR ratios achieved in the sample group P and the sample group Q. Further, as the function layer is close to the spacer player, the spin filtering effect is understood to appear remarkably. As in the case of the previously-described embodiment, when the sample R group and the sample S group are compared with each other, the MR ratio is understood to become greater in the function layer formed through the thin-film formation process such as that shown in FIGS. 2A-2E.

Ninth Embodiment

In all of the first through eighth embodiments, the function layer is prepared in the magnetization fixed layer or the magnetization free layer, and the function layer has been verified to play a great role in improvement of the MR ratio. However, spin-dependent scattering responsible for fluctuations in an MR ratio does not appear solely in the magnetization fixed layer or the magnetization free layer. Conduction electrons are subjected to spin-dependent scattering even in the interface between the spacer layer and the magnetization fixed layer or the interface between the magnetization free layer and the spacer layer.

Accordingly, in the ninth embodiment, there is conducted a study on the position of the function layer in the magnetization fixed layer or the magnetization free layer, wherein the function layer increases spin-dependent scattering at the interface between the spacer layer and the magnetization fixed layer or the magnetization free layer.

Figure 8:
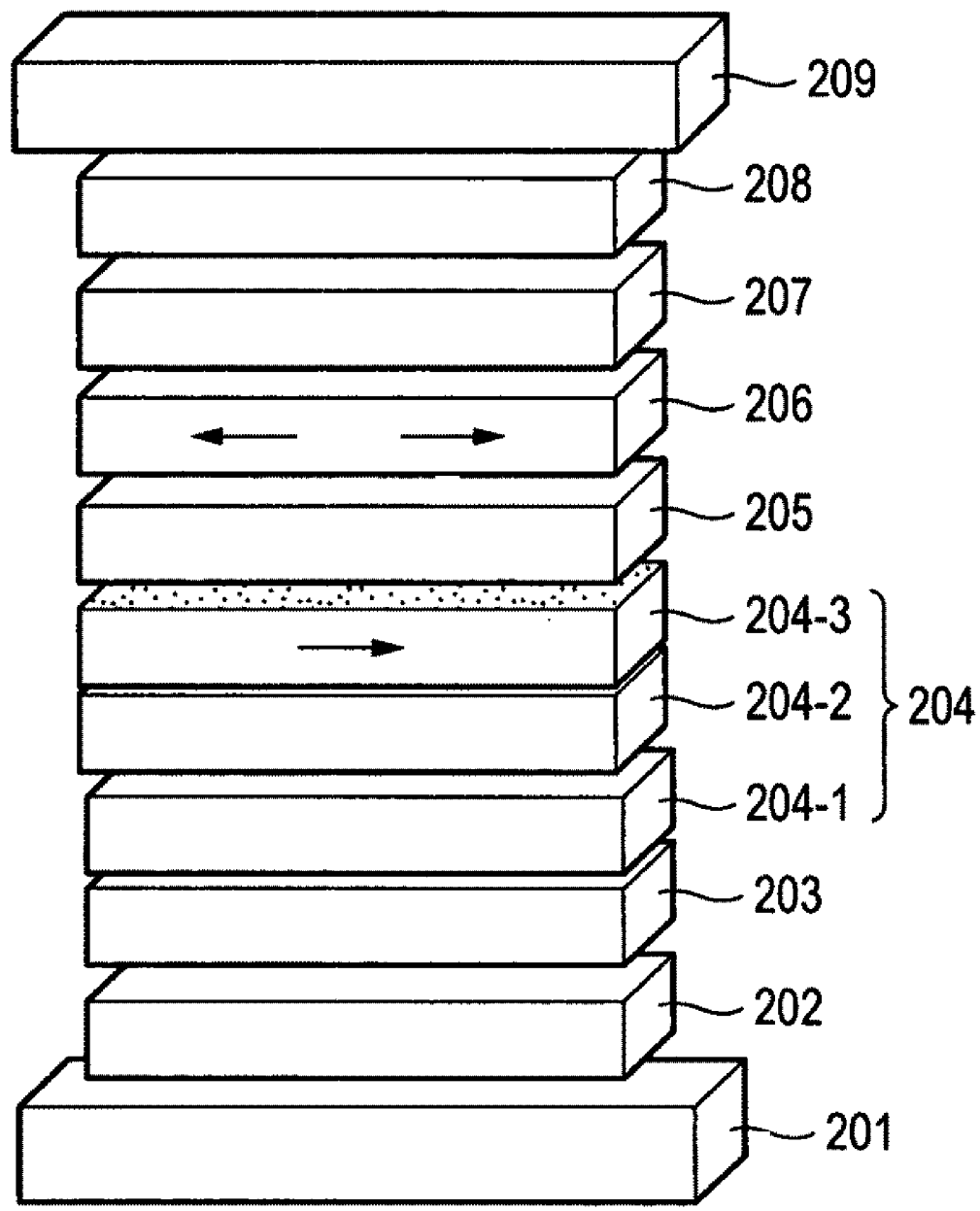
FIG. 8 is a structural drawing of a magnetoresistance effect element according to a ninth embodiment of the present invention.

FIG. 8 shows the magnetoresistance effect element of the ninth embodiment. In FIG. 8, the magnetoresistance effect element of the present embodiment has a structure where there are stacked a first electrode 201; a substrate layer 202 including a Ta layer of 5 nm and an Ru layer of 2 nm; an anti-ferromagnetic layer 203 formed from PtMn to a thickness of about 15 nm; a magnetization fixed layer 204 including a first magnetization fixed layer 204-1 formed from $Co_{90}Fe_{10}$ to a thickness of 3 to 4 nm or thereabouts, a magnetization anti-parallel coupling layer 204-2 formed from Ru to a thickness of about 0.9 nm or thereabouts, and a second magnetization fixed layer 204-3 formed from $Co_{90}Fe_{10}$ layer; a spacer layer 205 formed from Cu to a thickness of about 3 nm; a magnetization free layer 206 formed from a $Co_{90}Fe_{10}$ layer; a first protective layer 207 formed from Cu to a thickness of about 1 nm; a second protective layer 208 formed from Ru to a thickness of about 5 nm; and a second electrode 209.

A function layer 210-1 exists along an interface between the second magnetization fixed layer 204-3 and the spacer layer 205, and the function layer 210-2 exists along an interface between the magnetization free layer 206 and the spacer layer 205. The total thickness of the second magnetization fixed layer 204-3 and the function layer 210-1 is about 3 nm, and the total thickness of the magnetization free layer 206 and the function layer 210-2 is about 3 nm.

Table 9, shown in FIG. 20, shows a comparison between the magnitude of the MR ratio acquired in the magnetoresistance effect element, where the function layer is provided in the magnetization fixed layer, and the MR ratio acquired in the magnetoresistance effect element, where the function layer exists along the interface between the magnetization fixed layer and the spacer layer. The oxide layer of Fe used in the first embodiment is applied to the function layer. Those oxidation conditions, AIT conditions, and the like, which are used for the sample groups A-1 to A-4 and B-1 to B-4 of the first embodiment, are used in an unmodified form.

According to Table 9, even when the function layer 210-1 is inserted along the interface between the second magnetization fixed layer 204-3 and the spacer layer 205, or the function layer 210-2 is inserted along the interface between the magnetization free layer 206 and the spacer layer 205, a spin filtering effect similar to that yielded in the first through eighth embodiments is yielded. Moreover, as in the case of the first through eighth embodiments, the MR ratios of the samples (U-1, U-2, U-3, and U-4) whose function layers are formed through the thin film formation process shown in FIGS. 2A-2E are understood to have become greater than the MR ratios of the samples (T-1, T-2, T-3, and T-4) of the magnetoresistance effect element having the functions which are formed through a process not including the thin film formation process such as that shown in FIGS. 2A-2E. The reason for this is that a function layer having a uniform thickness can be grown in the process shown in FIGS. 2A-2E, as has been described in connection with the first embodiment and the like.

As mentioned above, in the ninth embodiment, the function layer 210-1 is inserted along the interface between the second magnetization fixed layer 204-3 and the spacer layer 205, or the function layer 210-2 is inserted along the interface between the magnetization free layer 206 and the spacer layer 205. However, the function layer may be inserted between the two interfaces. In that case, a synergistic effect of the spin-filtering effect yielded by the second magnetization fixed layer and the spin-filtering effect yielded by the magnetization free layer is exhibited. Moreover, the magnetoresistance effect element having a higher MR ratio can be manufactured.

Tenth Embodiment

Although all of the above embodiments relate to the magnetoresistance effect elements of the GMR structure, the present invention is not limited to the GMR structure but may also be applied to a TMR structure. In the present embodiment, there is shown a magnetoresistance effect element in which a function layer is formed from a TMR structure. In the TMR structure, the function layer of the GMR structure corresponds to a barrier layer. The magnetoresistance effect element of the TMR structure currently encounters the problem of a reduction in RA of a reproduction head of a hard disk drive. In order to achieve a lower RA, the thickness of the barrier layer must be reduced. Incidentally, when the thickness of the barrier layer is reduced, there arises a problem of formation of pin holes in the barrier layer and a significant reduction in MR.

Figure 10:
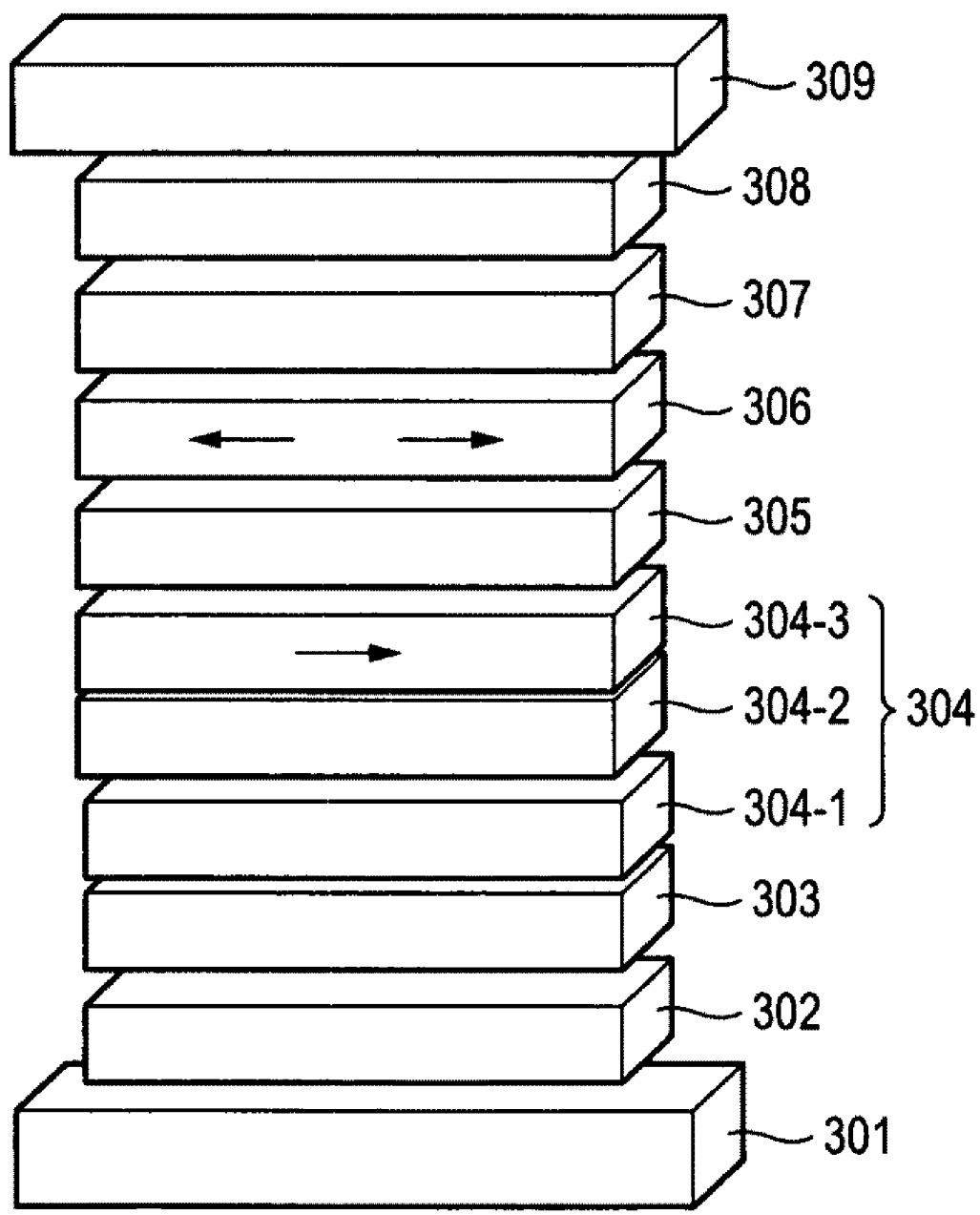
FIG. 10 is a structural drawing of a magnetoresistance effect element according to a tenth embodiment of the present invention.

In FIG. 10, the magnetoresistance effect element of the present embodiment has a structure where there are stacked a first electrode 201; a substrate layer 202 including a Ta layer of 5 nm and an Ru layer of 2 nm; an anti-ferromagnetic layer 203 formed from PtMn to a thickness of 15 nm; a magnetization fixed layer 204 including a first magnetization fixed layer 204-1 formed from Co90Fe10 to a thickness of 3 to 4 nm or thereabouts, a magnetization anti-parallel coupling layer 204-2 formed from Ru to a thickness of about 0.9 nm or thereabouts, and a second magnetization fixed layer 204-3 formed from $Co_{90}Fe_{10}$ layer to a thickness of 2 nm or thereabouts; a barrier layer 211 formed from AlO; a magnetization free layer 206 having a two-layer structure having a $Co_{75}Fe_{25}$ layer of about 2 nm and an Ni80Fe20 layer of about 3.5 nm; a first protective layer 207 formed from Cu to a thickness of about 1 nm; a second protective layer 8 formed from Ru to a thickness of about 5 nm; and a second electrode 9.

Table 10, shown in FIG. 21, shows processes for forming the barrier layer 211.

Table 10 shows that all of the samples W-1, W-2, W-3, and W-4, where the barrier layers are formed through the processes shown in FIGS. 2A-2E, exhibit MR ratios which are greater than those exhibited by the samples V-1, V-2, V-3, and V-4 formed from thick AlO from the beginning. The reason for this is that the number of pin holes is decreased and that a uniform barrier layer is created.

In the tenth embodiment, the barrier layer is taken as an oxide of Al. However, the barrier layer is not limited to this material. The essential requirement for the barrier layer is to be an oxide, a nitride, or a fluoride formed by oxidizing, nitriding, or fluorinating metal or an alloy containing at least one selected from the group comprising Fe, Co, Ni, Cu, Ti, V, Cr, Mn, Mg, Al, Si, Zr, Nb, Mo, Ru, Rh, Pd, Ag, Hf, Ta, W, Re, Ir, Pt, and Au. Even in this case, a barrier layer can be made uniform through the thin-film formation process.

In the tenth embodiment, the barrier layer is subjected to the processes of the present invention. As in the case of the first through ninth embodiments, the present invention is also naturally applied as a process for forming a function layer to be inserted into the magnetization fixed layer or the magnetization free layer.

The present invention is not limited to the embodiments set forth. In a practical stage, constituent elements can be embodied while being modified without departing from the gist of the invention. Various inventions can be created by an appropriate combination of the plurality of constituent elements described in the embodiments. For instance, some constituent elements may be deleted from all of the constituent elements described in the embodiments. Moreover, the constituent elements described in the different embodiments may also be combined as appropriate.

According to the method of the present invention for manufacturing a magnetoresistance effect element, there can be provided a magnetoresistance effect element which exhibits a large amount of change in magnetoresistance, high reliability, and high magnetic stability. Consequently, highly-sensitive magnetic detection is stably achieved. There can be provided a magnetic head which exhibits a high signal-to-noise ratio even at high recording density and a high output; a magnetic reproducing apparatus equipped with the head; and highly-integrated magnetic memory.

What is claimed is:

1. A method for manufacturing a magnetoresistance effect element having a magnetization fixed layer, a non-magnetic intermediate layer, and a magnetization free layer which are sequentially stacked, the method comprising:
    forming at least a part of either one of the magnetization fixed layer and the magnetization free layer;
    forming a further layer including at least one of an oxide, a nitride, and a fluoride on the part of the one of the magnetization fixed layer and the magnetization free layer; and
    exposing the further layer to either one of an ion beam and plasma irradiation to uniformly reduce a thickness of the further layer and provide a function layer of uniform thickness on the part of the one of magnetization fixed layer and the magnetization free layer.

2. The method according to claim 1, wherein the ion beam is irradiated at a voltage of 110V or less.

3. The method according to claim 1, wherein the plasma irradiation is performed at a plasma power in a range from 15W to 30W.

4. The method according to claim 1, further comprising forming the non-magnetic intermediate layer by a conductive material.

5. The method according to claim 1, further comprising forming the non-magnetic intermediate layer by a non-conductive material.

6. A method for manufacturing a magnetoresistance effect element having a magnetization fixed layer, a non-magnetic insulating intermediate layer, and a magnetization free layer which are sequentially stacked, the method comprising:
    forming the non-magnetic insulating intermediate layer by one of an oxide, a nitride, and a fluoride; and
    exposing the non-magnetic insulating intermediate layer to either one of an ion beam and plasma irradiation to uniformly reduce a thickness of the non-magnetic insulating intermediate layer to provide a non-magnetic insulating intermediate layer of uniform thickness.

* * * * *

UNITED STATES PATENT AND TRADEMARK OFFICE
CERTIFICATE OF CORRECTION

PATENT NO. : 7,897,201 B2  
APPLICATION NO. : 11/703830  
DATED : March 1, 2011  
INVENTOR(S) : Yuasa et al.

Page 1 of 1

It is certified that error appears in the above-identified patent and that said Letters Patent is hereby corrected as shown below:

On the Title Page Item (56), References Cited, insert the following list in the OTHER PUBLICATIONS section:

--Fukuzawa et al., Application No. 11/001,174, filed December 2, 2004  
Fukuzawa et al., Application No. 11/199,448, filed August 9, 2005  
Fuji et al., Application No. 11/583,968, filed October 20, 2006  
Fukuzawa et al., Application No. 11/783,011, filed April 5, 2007  
Fuji et al., Application No. 11/802,474, filed May 23, 2007  
Fuke et al., Application No. 11/822,700, filed July 9, 2007  
Fuke et al., Application No. 11/892,890, filed August 28, 2007  
Zhang et al., Application No. 11/906,716, filed October 3, 2007  
Fuke et al., Application No. 12/071,589, filed February 22, 2008  
Fukuzawa et al., Application No. 12/086,761, filed June 19, 2008  
Fukuzawa et al., Application No. 12/248,578, filed October 9, 2008  
Fuji et al., Application No. 12/314,811, filed December 17, 2008  
Fukuzawa et al., Application No. 12/347,543, filed December 31, 2008  
Yuasa et al., Application No. 12/585,851, filed September 25, 2009  
Yuasa et al., Application No. 12/585,852, filed September 25, 2009  
Yuasa et al., Application No. 12/585,854, filed September 25, 2009  
Yuasa et al., Application No. 12/585,855, filed September 25, 2009.--

Signed and Sealed this  
Twenty-sixth Day of July, 2011

David J. Kappos  
*Director of the United States Patent and Trademark Office*